United States Patent
Ma et al.

(10) Patent No.: US 11,887,554 B2
(45) Date of Patent: Jan. 30, 2024

(54) SHIFT REGISTER, GATE DRIVE CIRCUIT AND DRIVE METHOD THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Rui Ma, Beijing (CN); Xiaoye Ma, Beijing (CN); Ruifang Du, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/779,602

(22) PCT Filed: Feb. 19, 2020

(86) PCT No.: PCT/CN2020/075816
§ 371 (c)(1),
(2) Date: May 25, 2022

(87) PCT Pub. No.: WO2021/163912
PCT Pub. Date: Aug. 26, 2021

(65) Prior Publication Data
US 2022/0415276 A1    Dec. 29, 2022

(51) Int. Cl.
 *G09G 3/36*  (2006.01)
 *G11C 19/28* (2006.01)
 *G09G 3/3266* (2016.01)

(52) U.S. Cl.
 CPC ......... *G09G 3/3674* (2013.01); *G09G 3/3677* (2013.01); *G11C 19/28* (2013.01);
(Continued)

(58) Field of Classification Search
 CPC .. G09G 3/3674; G09G 3/3677; G09G 3/3266; G09G 2230/00; G09G 2300/0408;
(Continued)

(56) References Cited

U.S. PATENT DOCUMENTS

2015/0002504 A1\* 1/2015 Jo .................. G09G 3/3677
 345/99
2016/0307641 A1 10/2016 Zheng et al.
(Continued)

FOREIGN PATENT DOCUMENTS

CN    106652875 A    5/2017

OTHER PUBLICATIONS

Extended European Search Report for corresponding European Application No. 20920487.4, dated Oct. 24, 2022, 11 pages.
(Continued)

*Primary Examiner* — Adam J Snyder
(74) *Attorney, Agent, or Firm* — Dority & Manning, P.A.

(57) ABSTRACT

A shift register includes an input sub-circuit, a first noise reduction sub-circuit, and a first pull-down sub-circuit. The first noise reduction sub-circuit is coupled to the pull-up node, the first pull-down node and a first voltage signal terminal, and is configured to transmit a first voltage signal to the pull-up node under control of the first pull-down node; the input sub-circuit is coupled to the pull-up node and a signal input terminal, and is configured to transmit an input signal to the pull-up node in response to the input signal; the first pull-down sub-circuit is coupled to the signal input terminal, the first pull-down node and the first voltage signal terminal, and is configured to transmit the first voltage signal to the first pull-down node in response to the input signal, so that the first noise reduction sub-circuit stops transmitting the first voltage signal to the pull-up node.

14 Claims, 9 Drawing Sheets

(52) U.S. Cl.
CPC ....... *G09G 3/3266* (2013.01); *G09G 2230/00* (2013.01); *G09G 2300/0408* (2013.01); *G09G 2300/0426* (2013.01); *G09G 2310/0267* (2013.01); *G09G 2310/0286* (2013.01); *G09G 2320/0257* (2013.01); *G11C 19/287* (2013.01)

(58) Field of Classification Search
CPC ... G09G 2300/0426; G09G 2310/0267; G09G 2310/0286; G09G 2320/0257; G11C 19/28; G11C 19/287
See application file for complete search history.

(56) References Cited

U.S. PATENT DOCUMENTS

| | | |
|---|---|---|
| 2017/0316751 A1 | 11/2017 | Wang |
| 2018/0204494 A1* | 7/2018 | Shang .................. G09G 3/3677 |
| 2019/0173455 A1 | 6/2019 | Ko |
| 2020/0027515 A1 | 1/2020 | Gu et al. |
| 2020/0357352 A1 | 11/2020 | Du et al. |
| 2021/0134204 A1 | 5/2021 | Zheng et al. |
| 2021/0193006 A1 | 6/2021 | Wang et al. |

OTHER PUBLICATIONS

PCT International Search Report and Written Opinion (with English translation) for corresponding PCT Application No. PCT/CN2020/075816, dated Nov. 20, 2020, 12 pages.
Chinese Office Action (w/ English translation) for corresponding CN Application No. 202080000129.6, dated Jul. 29, 2023, 34 pages.
Indian Office Action for corresponding IN Application No. 202227048615, dated Jul. 3, 2023, 7 pages.

\* cited by examiner

SHIFT REGISTER, GATE DRIVE CIRCUIT AND DRIVE METHOD THEREOF

CROSS-REFERENCE TO RELATED APPLICATION

This application is a national phase entry under 35 USC 371 of International Patent Application No. PCT/CN2020/075816, filed on Feb. 19, 2020, which is incorporated herein by reference in its entirety.

TECHNICAL FIELD

The present disclosure relates to the field of display technologies, and in particular, to a shift register, a gate drive circuit and a drive method thereof.

BACKGROUND

In a display apparatus, a gate drive circuit is used for achieving a shift register function, and each shift register included in the gate drive circuit is coupled to a gate line. In a frame, the gate drive circuit provides output signals (gate scanning signals) for all gate lines row by row, so that the gate lines are driven, and the display apparatus is driven to perform display.

SUMMARY

In an aspect, a shift register is provided. The shift register includes a pull-up node, a first pull-down node, an input sub-circuit, a first noise reduction sub-circuit and a first pull-down sub-circuit. The first noise reduction sub-circuit is coupled to the pull-up node, the first pull-down node and a first voltage signal terminal. The first noise reduction sub-circuit is configured to transmit a first voltage signal received at the first voltage signal terminal to the pull-up node under control of a voltage of the first pull-down node. The input sub-circuit is coupled to the pull-up node and a signal input terminal. The input sub-circuit is configured to transmit an input signal to the pull-up node in response to the input signal received at the signal input terminal. The first pull-down sub-circuit is coupled to the signal input terminal, the first pull-down node and the first voltage signal terminal. The first pull-down sub-circuit is configured to transmit the first voltage signal received at the first voltage signal terminal to the first pull-down node in response to the input signal received at the signal input terminal, so that the first noise reduction sub-circuit is turned off under control of a voltage of the first voltage signal transmitted to the first pull-down node to stop transmitting the first voltage signal to the pull-up node.

In some embodiments, the first noise reduction sub-circuit includes a first transistor. A control electrode of the first transistor is coupled to the first pull-down node, a first electrode of the first transistor is coupled to the first voltage signal terminal, and a second electrode of the first transistor is coupled to the pull-up node. The input sub-circuit includes a second transistor. A control electrode of the second transistor is coupled to the signal input terminal, a first electrode of the second transistor is coupled to the signal input terminal, and a second electrode of the second transistor is coupled to the pull-up node. The first pull-down sub-circuit includes a third transistor. A control electrode of the third transistor is coupled to the signal input terminal, a first electrode of the third transistor is coupled to the first voltage signal terminal, and a second electrode of the third transistor is coupled to the first pull-down node.

In some embodiments, the shift register further includes a first pull-down control sub-circuit. The first pull-down control sub-circuit is coupled to the first voltage signal terminal, a second voltage signal terminal, the pull-up node and the first pull-down node.

The first pull-down control sub-circuit is configured to: transmit a second voltage signal received at the second voltage signal terminal to the first pull-down node in response to the second voltage signal received at the second voltage signal terminal and the voltage of the first voltage signal transmitted to the pull-up node; and transmit the first voltage signal received at the first voltage signal terminal to the first pull-down node in response to the second voltage signal received at the second voltage signal terminal and a voltage of the input signal transmitted to the pull-up node.

In some embodiments, the first pull-down control sub-circuit includes a fourth transistor, a fifth transistor, a sixth transistor, a seventh transistor and a first control node.

A control electrode of the fourth transistor is coupled to the second voltage signal terminal, a first electrode of the fourth transistor is coupled to the second voltage signal terminal, and a second electrode of the fourth transistor is coupled to the first control node. A control electrode of the fifth transistor is coupled to the pull-up node, a first electrode of the fifth transistor is coupled to the first voltage signal terminal, and a second electrode of the fifth transistor is coupled to the first control node.

A control electrode of the sixth transistor is coupled to the first control node, a first electrode of the sixth transistor is coupled to the second voltage signal terminal, and a second electrode of the sixth transistor is coupled to the first pull-down node. A control electrode of the seventh transistor is coupled to the pull-up node, a first electrode of the seventh transistor is coupled to the first voltage signal terminal, and a second electrode of the seventh transistor is coupled to the first pull-down node.

In some embodiments, the shift register further includes: an energy storage sub-circuit, a first output sub-circuit, a second noise reduction sub-circuit and a reset sub-circuit. The energy storage sub-circuit is coupled to the pull-up node and the first output sub-circuit. The energy storage sub-circuit is configured to store the voltage of the input signal transmitted to the pull-up node. The first output sub-circuit is further coupled to a clock signal terminal, the pull-up node and a first signal output terminal. The first output sub-circuit is configured to transmit a clock signal received at the clock signal terminal to the first signal output terminal and the energy storage sub-circuit under control of the voltage of the input signal transmitted to the pull-up node.

The second noise reduction sub-circuit is coupled to the first pull-down node, a third voltage signal terminal and the first signal output terminal. The second noise reduction sub-circuit is configured to transmit a third voltage signal received at the third voltage signal terminal to the first signal output terminal under the control of the voltage of the first pull-down node. The reset sub-circuit is coupled to the pull-up node, the first voltage signal terminal and a reset signal terminal. The reset sub-circuit is configured to transmit the first voltage signal received at the first voltage signal terminal to the pull-up node in response to a reset signal received at the reset signal terminal.

In some embodiments, the first output sub-circuit includes an eighth transistor. A control electrode of the eighth transistor is coupled to the pull-up node, a first electrode of the eighth transistor is coupled to the clock signal terminal, and a second electrode of the eighth transistor is coupled to the first signal output terminal. The energy storage sub-circuit includes a first capacitor. A first terminal of the first capacitor is coupled to the pull-up node, and a second terminal of the first capacitor is coupled to the second electrode of the eighth transistor.

The second noise reduction sub-circuit includes a ninth transistor. A control electrode of the ninth transistor is coupled to the first pull-down node, a first electrode of the ninth transistor is coupled to the third voltage signal terminal, and a second electrode of the ninth transistor is coupled to the first signal output terminal. The reset sub-circuit includes a tenth transistor. A control electrode of the tenth transistor is coupled to the reset signal terminal, a first electrode of the tenth transistor is coupled to the first voltage signal terminal, and a second electrode of the tenth transistor is coupled to the pull-up node.

In some embodiments, the shift register further includes: a second pull-down node, a second pull-down control sub-circuit, a third noise reduction sub-circuit and a second pull-down sub-circuit. The second pull-down control sub-circuit is coupled to the first voltage signal terminal, a fourth voltage signal terminal, the pull-up node and the second pull-down node. The second pull-down control sub-circuit is configured to transmit: a fourth voltage signal received at the fourth voltage signal terminal to the second pull-down node in response to the fourth voltage signal received at the fourth voltage signal terminal and the voltage of the first voltage signal transmitted to the pull-up node; and transmit the first voltage signal received at the first voltage signal terminal to the second pull-down node in response to the fourth voltage signal received at the fourth voltage signal terminal and the voltage of the input signal transmitted to the pull-up node.

The third noise reduction sub-circuit is coupled to the pull-up node, the second pull-down node and the first voltage signal terminal; the third noise reduction sub-circuit is configured to transmit the first voltage signal received at the first voltage signal terminal to the pull-up node under control of a voltage of the fourth voltage signal transmitted to the second pull-down node. The second pull-down sub-circuit is coupled to the signal input terminal, the second pull-down node and the first voltage signal terminal; the second pull-down sub-circuit is configured to transmit the first voltage signal received at the first voltage signal terminal to the second pull-down node in response to the input signal received at the signal input terminal, so that the third noise reduction sub-circuit is turned off under control of the voltage of the first voltage signal transmitted to the second pull-down node to stop transmitting the first voltage signal to the pull-up node.

In some embodiments, the second pull-down control sub-circuit includes an eleventh transistor, a twelfth transistor, a thirteenth transistor, a fourteenth transistor and a second control node. A control electrode of the eleventh transistor is coupled to the fourth voltage signal terminal, a first electrode of the eleventh transistor is coupled to the fourth voltage signal terminal, and a second electrode of the eleventh transistor is coupled to the second control node. A control electrode of the twelfth transistor is coupled to the pull-up node, a first electrode of the twelfth transistor is coupled to the first voltage signal terminal, and a second electrode of the twelfth transistor is coupled to the second control node. A control electrode of the thirteenth transistor is coupled to the second control node, a first electrode of the thirteenth transistor is coupled to the fourth voltage signal terminal, and a second electrode of the thirteenth transistor is coupled to the second pull-down node. A control electrode of the fourteenth transistor is coupled to the pull-up node, a first electrode of the fourteenth transistor is coupled to the first voltage signal terminal, and a second electrode of the fourteenth transistor is coupled to the second pull-down node.

The third noise reduction sub-circuit includes a fifteenth transistor. A control electrode of the fifteenth transistor is coupled to the second pull-down node, a first electrode of the fifteenth transistor is coupled to the first voltage signal terminal, and a second electrode of the fifteenth transistor is coupled to the pull-up node. The second pull-down sub-circuit includes a sixteenth transistor. A control electrode of the sixteenth transistor is coupled to the signal input terminal, a first electrode of the sixteenth transistor is coupled to the first voltage signal terminal, and a second electrode of the sixteenth transistor is coupled to the second pull-down node.

In some embodiments, the shift register further includes: a fourth noise reduction sub-circuit. The fourth noise reduction sub-circuit is coupled to the second pull-down node, the third voltage signal terminal and the first signal output terminal. The fourth noise reduction sub-circuit is configured to transmit the third voltage signal received at the third voltage signal terminal to the first signal output terminal under the control of the voltage of the fourth voltage signal transmitted to the second pull-down node.

In some embodiments, the fourth noise reduction sub-circuit includes a seventeenth transistor. A control electrode of the seventeenth transistor is coupled to the second pull-down node, a first electrode of the seventeenth transistor is coupled to the third voltage signal terminal, and a second electrode of the seventeenth transistor is coupled to the first signal output terminal.

In some embodiments, the shift register further includes: a second output sub-circuit, a fifth noise reduction sub-circuit and a sixth noise reduction sub-circuit. The second output sub-circuit is coupled to the pull-up node, the clock signal terminal and a second signal output terminal. The second output sub-circuit is configured to transmit the clock signal received at the clock signal terminal to the second signal output terminal under the control of the voltage of the input signal transmitted to the pull-up node.

The fifth noise reduction sub-circuit is coupled to the first pull-down node, the first voltage signal terminal and the second signal output terminal. The fifth noise reduction sub-circuit is configured to transmit the first voltage signal received at the first voltage signal terminal to the second signal output terminal under the control of the voltage of the first pull-down node. The sixth noise reduction sub-circuit is coupled to the second pull-down node, the first voltage signal terminal and the second signal output terminal. The sixth noise reduction sub-circuit is configured to transmit the first voltage signal received at the first voltage signal terminal to the second signal output terminal under the control of the voltage of the fourth voltage signal transmitted to the second pull-down node.

In some embodiments, the second output sub-circuit includes an eighteenth transistor. A control electrode of the eighteenth transistor is coupled to the pull-up node, a first electrode of the eighteenth transistor is coupled to the clock signal terminal, and a second electrode of the eighteenth transistor is coupled to the second signal output terminal. The fifth noise reduction sub-circuit includes a nineteenth transistor. A control electrode of the nineteenth transistor is coupled to the first pull-down node, a first electrode of the nineteenth transistor is coupled to the first voltage signal terminal, and a second electrode of the nineteenth transistor is coupled to the second signal output terminal. The sixth noise reduction sub-circuit includes a twentieth transistor. A control electrode of the twentieth transistor is coupled to the second pull-down node, a first electrode of the twentieth transistor is coupled to the first voltage signal terminal, and a second electrode of the twentieth transistor is coupled to the second signal output terminal.

In some embodiments, the shift register further includes: an initialization sub-circuit. The initialization sub-circuit is coupled to the pull-up node, an initialization signal terminal and the first voltage signal terminal. The initialization sub-circuit is configured to transmit the first voltage signal received at the first voltage signal terminal to the pull-up node in response to an initialization signal received at the initialization signal terminal.

In some embodiments, the initialization sub-circuit includes a twenty-first transistor. A control electrode of the twenty-first transistor is coupled to the initialization signal terminal, a first electrode of the twenty-first transistor is coupled to the first voltage signal terminal, and a second electrode of the twenty-first transistor is coupled to the pull-up node.

In some embodiments, the shift register further includes a second pull-down node, a first pull-down control sub-circuit, a first output sub-circuit, an energy storage sub-circuit, a second noise reduction sub-circuit, a reset sub-circuit, a second pull-down control sub-circuit, a third noise reduction sub-circuit, a second pull-down sub-circuit, a fourth noise reduction sub-circuit, a second output sub-circuit, a fifth noise reduction sub-circuit, a sixth noise reduction sub-circuit and an initialization sub-circuit.

The first noise reduction sub-circuit includes the first transistor; the input sub-circuit includes the second transistor; the first pull-down sub-circuit includes the third transistor; and the first pull-down control sub-circuit includes the fourth transistor, the fifth transistor, the sixth transistor, the seventh transistor and the first control node. The first output sub-circuit includes the eighth transistor, the energy storage sub-circuit includes the first capacitor, the second noise reduction sub-circuit includes the ninth transistor, and the reset sub-circuit includes the tenth transistor.

The second pull-down control sub-circuit includes the eleventh transistor, the twelfth transistor, the thirteenth transistor, the fourteenth transistor and the second control node; the third noise reduction sub-circuit includes the fifteenth transistor; the second pull-down sub-circuit includes the sixteenth transistor; and the fourth noise reduction sub-circuit includes the seventeenth transistor. The second output sub-circuit includes the eighteenth transistor, the fifth noise reduction sub-circuit includes the nineteenth transistor, the sixth noise reduction sub-circuit includes the twentieth transistor, and the initialization sub-circuit includes the twenty-first transistor.

A control electrode of the first transistor is coupled to the first pull-down node, a first electrode of the first transistor is coupled to the first voltage signal terminal, and a second electrode of the first transistor is coupled to the pull-up node. A control electrode of the second transistor is coupled to the signal input terminal, a first electrode of the second transistor is coupled to the signal input terminal, and a second electrode of the second transistor is coupled to the pull-up node.

A control electrode of the third transistor is coupled to the signal input terminal, a first electrode of the third transistor is coupled to the first voltage signal terminal, and a second electrode of the third transistor is coupled to the first pull-down node. A control electrode of the fourth transistor is coupled to the second voltage signal terminal, a first electrode of the fourth transistor is coupled to the second voltage signal terminal, and a second electrode of the fourth transistor is coupled to the first control node.

A control electrode of the fifth transistor is coupled to the pull-up node, a first electrode of the fifth transistor is coupled to the first voltage signal terminal, and a second electrode of the fifth transistor is coupled to the first control node. A control electrode of the sixth transistor is coupled to the first control node, a first electrode of the sixth transistor is coupled to the second voltage signal terminal, and a second electrode of the sixth transistor is coupled to the first pull-down node.

A control electrode of the seventh transistor is coupled to the pull-up node, a first electrode of the seventh transistor is coupled to the first voltage signal terminal, and a second electrode of the seventh transistor is coupled to the first pull-down node. A control electrode of the eighth transistor is coupled to the pull-up node, a first electrode of the eighth transistor is coupled to the clock signal terminal, and a second electrode of the eighth transistor is coupled to the first signal output terminal.

A first terminal of the first capacitor is coupled to the pull-up node, and a second terminal of the first capacitor is coupled to the second electrode of the eighth transistor. A control electrode of the ninth transistor is coupled to the first pull-down node, a first electrode of the ninth transistor is coupled to the third voltage signal terminal, and a second electrode of the ninth transistor is coupled to the first signal output terminal.

A control electrode of the tenth transistor is coupled to the reset signal terminal, a first electrode of the tenth transistor is coupled to the first voltage signal terminal, and a second electrode of the tenth transistor is coupled to the pull-up node. A control electrode of the eleventh transistor is coupled to the fourth voltage signal terminal, a first electrode of the eleventh transistor is coupled to the fourth voltage signal terminal, and a second electrode of the eleventh transistor is coupled to the second control node.

A control electrode of the twelfth transistor is coupled to the pull-up node, a first electrode of the twelfth transistor is coupled to the first voltage signal terminal, and a second electrode of the twelfth transistor is coupled to the second control node. A control electrode of the thirteenth transistor is coupled to the second control node, a first electrode of the thirteenth transistor is coupled to the fourth voltage signal terminal, and a second electrode of the thirteenth transistor is coupled to the second pull-down node.

A control electrode of the fourteenth transistor is coupled to the pull-up node, a first electrode of the fourteenth transistor is coupled to the first voltage signal terminal, and a second electrode of the fourteenth transistor is coupled to the second pull-down node. A control electrode of the fifteenth transistor is coupled to the second pull-down node, a first electrode of the fifteenth transistor is coupled to the first voltage signal terminal, and a second electrode of the fifteenth transistor is coupled to the pull-up node.

A control electrode of the sixteenth transistor is coupled to the signal input terminal, a first electrode of the sixteenth transistor is coupled to the first voltage signal terminal, and a second electrode of the sixteenth transistor is coupled to the second pull-down node. A control electrode of the seventeenth transistor is coupled to the second pull-down node, a first electrode of the seventeenth transistor is coupled to the third voltage signal terminal, and a second electrode of the seventeenth transistor is coupled to the first signal output terminal.

A control electrode of the eighteenth transistor is coupled to the pull-up node, a first electrode of the eighteenth transistor is coupled to the clock signal terminal, and a second electrode of the eighteenth transistor is coupled to the second signal output terminal. A control electrode of the nineteenth transistor is coupled to the first pull-down node, a first electrode of the nineteenth transistor is coupled to the first voltage signal terminal, and a second electrode of the nineteenth transistor is coupled to the second signal output terminal.

A control electrode of the twentieth transistor is coupled to the second pull-down node, a first electrode of the twentieth transistor is coupled to the first voltage signal terminal, and a second electrode of the twentieth transistor is coupled to the second signal output terminal. A control electrode of the twenty-first transistor is coupled to the initialization signal terminal, a first electrode of the twenty-first transistor is coupled to the first voltage signal terminal, and a second electrode of the twenty-first transistor is coupled to the pull-up node.

In another aspect, a gate drive circuit is provided. The gate drive circuit includes at least two cascaded shift registers each described in the above aspect.

In some embodiments, in a case where the shift register further includes the first output sub-circuit, the reset sub-circuit, the second output sub-circuit, the fifth noise reduction sub-circuit and the sixth noise reduction sub-circuit, a signal input terminal of a first-stage shift register is coupled to a start signal terminal; a signal input terminal of an any-stage shift register except the first-stage shift register is coupled to a second signal output terminal of a previous-stage shift register of the any-stage shift register. A reset signal terminal of an any-stage shift register except a last-stage shift register is coupled to a second signal output terminal of a next-stage shift register of the any-stage shift register. A reset signal terminal of the last-stage shift register is coupled to a signal terminal separately provided for outputting the reset signal, or is coupled to the start signal terminal. A first signal output terminal of each shifter register is coupled to a single gate line.

In yet another aspect, a drive method of the gate drive circuit is provided. The drive method is applied to the gate drive circuit as described in the above aspect, and the drive method includes: a noise reduction phase and a charging phase included in a frame period for each shift register in the gate drive circuit.

The noise reduction phase includes: transmitting, by the first noise reduction sub-circuit, the first voltage signal received at the first voltage signal terminal to the pull-up node after the first noise reduction sub-circuit is turned on under the control of the voltage of the first pull-down node.

The charging phase includes: transmitting, by the input sub-circuit, the input signal received at the signal input terminal to the pull-up node after the input sub-circuit is turned on under control of the input signal transmitted by the signal input terminal; transmitting, by the first pull-down sub-circuit, the first voltage signal received at the first voltage signal terminal to the first pull-down node after the first pull-down sub-circuit is turned on under the control of the input signal; and stopping transmitting, by the first noise reduction sub-circuit, the first voltage signal received at the first voltage signal terminal to the pull-up node after the first noise reduction sub-circuit is turned off under the control of the voltage of the first voltage signal transmitted to the first pull-down node.

In some embodiments, the drive method further includes an operation of raising gate scanning signals output by all shift registers included in the gate drive circuit before a display apparatus to which the gate drive circuit is applied is shut down. In a case where the shift register further includes the reset sub-circuit, the initialization sub-circuit, the first pull-down control sub-circuit, the first output sub-circuit, the second noise reduction sub-circuit, the second output sub-circuit and the fifth noise reduction sub-circuit, and a cascade manner of the shift registers is the cascade manner as described in the above, the operation of raising the gate scanning signals output by all shift registers included in the gate drive circuit, includes:

pulling down the first voltage signal output by the first voltage signal terminal and a start signal output by the start signal terminal to ground, and raising an initialization signal output by the initialization signal terminal, a second voltage signal output by the second voltage signal terminal, a third voltage signal output by the third voltage signal terminal and a clock signal output by the clock signal terminal;

transmitting, by the initialization sub-circuit, the first voltage signal to the pull-up node after the initialization sub-circuit is turned on under control of the initialization signal, so that a voltage of the pull-up node is a grounding voltage; transmitting, by the first pull-down control sub-circuit, the second voltage signal to the first pull-down node in response to the second voltage signal and the grounding voltage of the pull-up node, so that a voltage of the first pull-down node is raised; transmitting, by the second noise reduction sub-circuit, the third voltage signal to the first signal output terminal after the second noise reduction sub-circuit is turned on under the control of the voltage of the first pull-down node, so that a voltage of a gate scanning signal output by the first signal output terminal is raised; transmitting, by the first noise reduction sub-circuit, the first voltage signal to the pull-up node after the first noise reduction sub-circuit is turned on under the control of the voltage of the first pull-down node, so that the voltage of the pull-up node is the grounding voltage; and transmitting, by the fifth noise reduction sub-circuit, the first voltage signal to the second signal output terminal after the fifth noise reduction sub-circuit is turned on under the control of the voltage of the first pull-down node, so that a voltage of a signal output by the second signal output terminal is the grounding voltage.

In some embodiments, the drive method further includes an operation of raising gate scanning signals output by all shift registers included in the gate drive circuit before a display apparatus to which the gate drive circuit is applied is shut down. In a case where the shift register further includes the reset sub-circuit, the initialization sub-circuit, the first pull-down control sub-circuit, the first output sub-circuit, the second noise reduction sub-circuit, the second output sub-circuit and the fifth noise reduction sub-circuit, and a cascade manner of the shift registers is the cascade manner as described in the above, the operation of raising the gate scanning signals output by all shift registers included in the gate drive circuit, includes:

pulling down the first voltage signal output by the first voltage signal terminal, a start signal output by the start signal terminal and an initialization signal output by the initialization signal terminal to ground, and raising a second voltage signal output by the second voltage signal terminal, a third voltage signal output by the third voltage signal terminal and a clock signal output by the clock signal terminal;

turning off the initialization sub-circuit under control of the initialization signal; transmitting, by the first pull-down control sub-circuit, the second voltage signal to the first pull-down node in response to the second voltage signal and a voltage of the pull-up node, so that a voltage of the first pull-down node is raised; transmitting, by the second noise reduction sub-circuit, the third voltage signal to a first signal output terminal after the second noise reduction sub-circuit is turned on under the control of the voltage of the first pull-down node, so that a voltage of a gate scanning signal output by the first signal output terminal is raised; transmitting, by the first noise reduction sub-circuit, the first voltage signal to the pull-up node after the first noise reduction sub-circuit is turned on under the control of the voltage of the first pull-down node, so that the voltage of the pull-up node is the grounding voltage; and transmitting, by the fifth noise reduction sub-circuit, the first voltage signal to the second signal output terminal after the fifth noise reduction sub-circuit is turned on under the control of the voltage of the first pull-down node, so that a voltage of a signal output by the second signal output terminal is the grounding voltage.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of or the plurality of" means two or more unless otherwise specified.

In the description of some embodiments, terms such as "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. The embodiments disclosed herein are not necessarily limited to the contents herein.

In a display apparatus, a gate drive circuit includes a plurality of shift registers, and each shift register is electrically connected to a gate line to provide a scanning signal to the gate line electrically connected thereto. Therefore, a plurality of gate lines in the display panel are scanned row by row.

Figure 1:
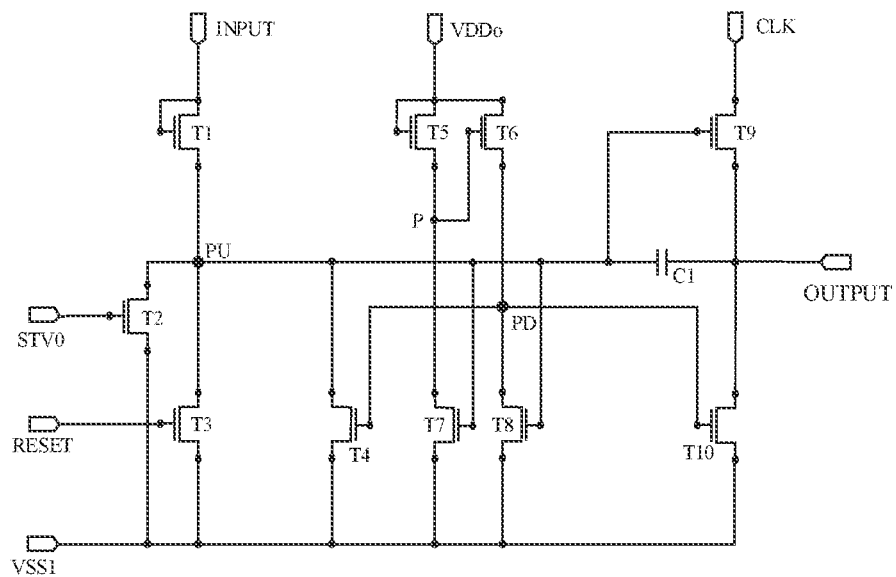
FIG. 1 is a structural diagram of a shift register, in accordance with the related art.

In the related art, as shown in FIG. 1, a shift register includes a plurality of transistors, at least one storage capacitor, a pull-up node PU and a pull-down node PD. For example, a level of a first voltage signal transmitted by a first voltage signal terminal VSS1 continues to be a low level, and a level of a second voltage signal transmitted by a second voltage signal terminal VDDo continues to be a high level. A drive method of the shift register as shown in FIG.

1 is exemplarily described by considering an example in which the high level is an operation level that enables the transistor to be turned on.

As shown in FIG. 1, in a noise reduction phase, under control of the second voltage signal transmitted by the second voltage signal terminal VDDo, a transistor T5 and a transistor T6 are turned on to transmit the second voltage signal to the pull-down node PD, so that a potential of the pull-down node PD is raised. Under control of the voltage of the pull-down node PD, a transistor T4 is turned on to transmit the first voltage signal received at the first voltage signal terminal VSS1 to the pull-up node PU, so as to perform a noise reduction on the pull-up node PU.

In a charging phase, a level of an input signal transmitted by a signal input terminal INPUT is a high level, and a transistor T1 is turned on to transmit the input signal to the pull-up node PU, so that a voltage of the pull-up node PU is raised. Under control of the voltage of the pull-up node PU, a transistor T7 and a transistor T8 are turned on to transmit the first voltage signal received at the first voltage signal terminal VSS1 to the pull-down node PD, so as to pull down the potential of the pull-down node PD and enable the transistor T4 to be turned off. As a result, the first voltage signal received at the first voltage signal terminal VSS1 is stopped transmitting to the pull-up node PU, which enables the pull-up node PU to be adequately charged. Thus, under control of the pull-up node PU, a transistor T9 is turned on to transmit a clock signal received at a clock signal terminal CLK to a signal output terminal OUTPUT.

In the above shift register, when charging the pull-up node PU, the potential of the pull-up node PU is firstly raised, so that the transistor T7 and the transistor T8 are turned on under the control of the voltage of the pull-up node PU; and then the potential of the pull-down node PD is pulled down, so that the transistor T4 is controlled to be turned off. As a result, the first voltage signal is stopped transmitting to the pull-up node PU, which is equivalent to indirectly pulling down the potential of the pull-down node PD. In practical products, the potential of the pull-down node PD may not be pulled down in time due to an existence of a signal delay phenomenon, so that the transistor T4 is still turned on to transmit the first voltage signal to the pull-up node PU. As a result, the pull-up node PU is unable to be adequately charged, so that the pull-up node PU is insufficiently charged or the voltage of the pull-up node PU is unable to be rapidly raised to an ideal voltage, which affects normal operation of the shift register.

Moreover, in a pull-down control module composed of the transistor T5, the transistor T6, the transistor T7 and the transistor T8, since the level of the second voltage signal transmitted by the second voltage signal terminal VDDo continues to be the high level, the transistor T5 and the transistor T6 continue to be turned on under control of the second voltage signal. When the voltage of the pull-up node PU is a high voltage, the transistor T7 and the transistor T8 are turned on. When the transistor T5, the transistor T6, the transistor T7 and the transistor T8 are all turned on, if the voltage of the pull-down node PD is required to be pulled down to a low voltage, it is necessary to set an appropriate dimension of the transistor (here, the dimension of the transistor refers to a width-to-length ratio of a channel of the transistor). For example, it is necessary to set a dimension of the transistor T7 to be greater than a dimension of the transistor T5, and a dimension of the transistor T8 to be greater than a dimension of the transistor T6, so that the voltage of the pull-down node PD can be pulled down to the low voltage when these four transistors are all turned on. In this way, a manufacturing difficulty will be increased in a manufacturing process of a display substrate.

Furthermore, as usage time of the product increases, a threshold voltage of each transistor drifts, and a drift amount is different, which will affect a change of the voltage of the pull-down node PD. Therefore, the voltage of the pull-down node PD is unable to be effectively pulled down to the low voltage, and in the charging phase, the transistor T4 is still turned on to transmit the first voltage signal to the pull-up node PU. As a result, the pull-up node PU is unable to be adequately charged, so that the pull-up node PU is insufficiently charged or the voltage of the pull-up node PU is unable to be rapidly raised to an ideal voltage, which affects the normal operation of the shift register.

Based on this, as shown in FIGS. 2A to 3B, some embodiments of the present disclosure provide a shift register RS. The shift register RS includes a pull-up node PU, a first pull-down node PDo, a first noise reduction sub-circuit 101, an input sub-circuit 102 and a first pull-down sub-circuit 103.

The first noise reduction sub-circuit 101 is coupled to the pull-up node PU, the first pull-down node PDo and a first voltage signal terminal VSS1. The first noise reduction sub-circuit 101 is configured to transmit a first voltage signal received at the first voltage signal terminal VSS1 to the pull-up node PU under control of a voltage of the first pull-down node PDo.

The input sub-circuit 102 is coupled to the pull-up node PU and the signal input terminal INPUT. The input sub-circuit 102 is configured to transmit an input signal to the pull-up node PU in response to the input signal received at the signal input terminal INPUT.

The first pull-down sub-circuit 103 is coupled to the signal input terminal INPUT, the first pull-down node PDo and the first voltage signal terminal VSS1. The first pull-down sub-circuit 103 is configured to transmit the first voltage signal received at the first voltage signal terminal VSS1 to the first pull-down node PDo in response to the input signal received at the signal input terminal INPUT, so that the first noise reduction sub-circuit 101 is turned off under control of a voltage of the first voltage signal transmitted to the first pull-down node PDo to stop transmitting the first voltage signal to the pull-up node PU.

It will be noted that, the pull-up node PU does not represent a fixed physical structure, but represents a node having a specific voltage (here, being the voltage of the pull-up node PU), and any point having the specific voltage may be the pull-up node PU. In FIGS. 2A to 3B, the pull-up node PU is not limited to positions shown in the figures. For example, in a case where a resistance of a wire is not considered, any one of points on the wire coupled to the pull-up node PU shown in the figures may be the pull-up node, and a voltage of the points is equal to the voltage of the pull-up node PU.

In the shift register RS provided in the embodiments of the present disclosure, the input sub-circuit 102 and the first pull-down sub-circuit 103 are both coupled to the signal input terminal INPUT and are both turned on under control of the input signal transmitted by the signal input terminal INPUT, thereby achieving signal transmission. Thus, in a charging phase, while the input sub-circuit 102 is turned on under the control of the input signal, the first pull-down sub-circuit 103 is also turned on under the control of the input signal to transmit the first voltage signal received at the first voltage signal terminal VSS1 to the first pull-down node PDo. As a result, the voltage of the first pull-down node PDo is changed. For example, in the case where the level of the first voltage signal is the low level, the voltage of the first pull-down node PDo is directly pulled down by the first pull-down sub-circuit 103, so that the first noise reduction sub-circuit 101 is turned off under the control of the voltage of the first voltage signal transmitted to the first pull-down node PDo to stop transmitting the first voltage signal to the pull-up node PU, thereby ensuring the pull-up node PU to be adequately charged.

In this way, compared to the shift register in the related art in which the voltage of the pull-down node PD is pulled down in the charging phase by the pull-down control module composed of the transistor T5, the transistor T6, the transistor T7 and the transistor T8, the shift register RS provided in the embodiments of the present disclosure adds the first pull-down sub-circuit 103, so that the voltage of the first pull-down node PDo may be rapidly pulled down by the first pull-down sub-circuit 103. This manner is more direct and effective, ensures that the pull-up node PU is adequately charged, and avoids that the voltage of the first pull-down node PDo cannot be rapidly pulled down due to a signal delay and the threshold voltage drift of the transistor, which affects the charging of the pull-up node PU. Thus, reliability of a product is improved.

Figure 3A:
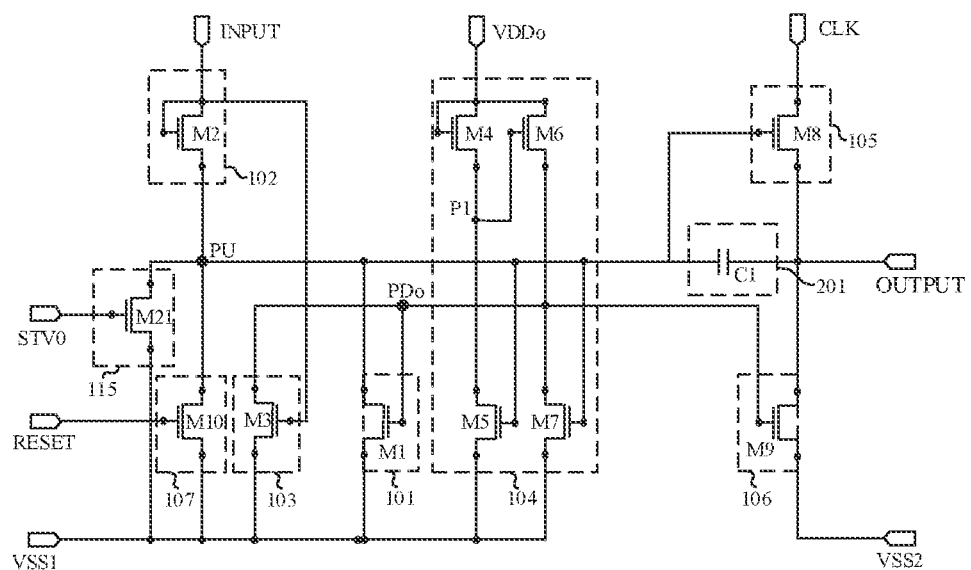
FIG. 3A is a structural diagram of yet another shift register, in accordance with some embodiments of the present disclosure.
Figure 3B:
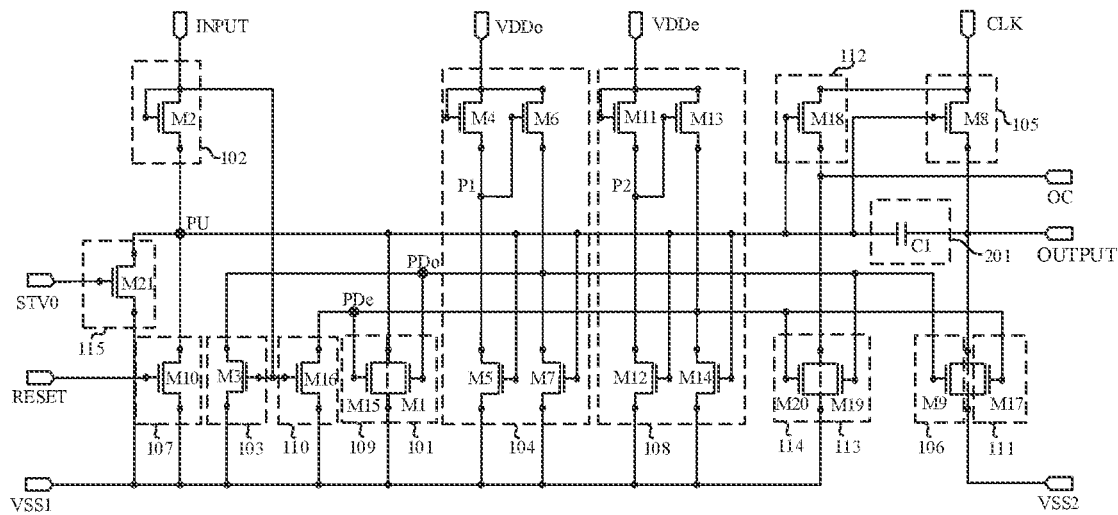
FIG. 3B is a structural diagram of yet another shift register, in accordance with some embodiments of the present disclosure.

In some examples, as shown in FIGS. 3A and 3B, the first noise reduction sub-circuit 101 includes a first transistor M1. A control electrode of the first transistor M1 is coupled to the first pull-down node PDo, a first electrode of the first transistor M1 is coupled to the first voltage signal terminal VSS1, and a second electrode of the first transistor M1 is coupled to the pull-up node PU. The first transistor M1 is configured to be turned on under the control of the voltage of the first pull-down node PDo to transmit the first voltage signal received at the first voltage signal terminal VSS1 to the pull-up node PU.

The input sub-circuit 102 includes a second transistor M2. A control electrode of the second transistor M2 is coupled to the signal input terminal INPUT, a first electrode of the second transistor M2 is coupled to the signal input terminal INPUT, and a second electrode of the second transistor M2 is coupled to the pull-up node PU. The second transistor M2 is configured to be turned on under control of the input signal to transmit the input signal to the pull-up node PU, so as to charge the pull-up node PU.

The first pull-down sub-circuit 103 includes a third transistor M3. A control electrode of the third transistor M3 is coupled to the signal input terminal INPUT, a first electrode of the third transistor M3 is coupled to the first voltage signal terminal VSS1, and a second electrode of the third transistor M3 is coupled to the first pull-down node PDo. The third transistor M3 is configured to be turned on under the control of the input signal to transmit the first voltage signal received at the first voltage signal terminal VSS1 to the first pull-down node PDo.

It will be understood by those skilled in the art that, in the shift register, in addition to the first noise reduction sub-circuit 101, the input sub-circuit 102 and the first pull-down sub-circuit 103, the shift register also includes other sub-circuits, such as an output sub-circuit, a reset sub-circuit, a pull-down node control sub-circuit, etc. The embodiments of the present disclosure do not limit specific arrangement manners of other sub-circuits, as long as the operation of the shift register can be ensured. Other sub-circuits included in the shift register RS mentioned below are only a few arrangement manners provided in the embodiments of the present disclosure.

In some embodiments, the shift register RS further includes the first pull-down control sub-circuit 104.

The first pull-down control sub-circuit 104 is coupled to the first voltage signal terminal VSS1, a second voltage signal terminal VDDo, the pull-up node PU and the first pull-down node PDo.

The first pull-down control sub-circuit 104 is configured to: transmit a second voltage signal received at the second voltage signal terminal VDDo to the first pull-down node PDo in response to the second voltage signal received at the second voltage signal terminal VDDo and the voltage of the first voltage signal transmitted to the pull-up node PU; and transmit the first voltage signal received at the first voltage signal terminal VSS1 to the first pull-down node PDo in response to the second voltage signal received at the second voltage signal terminal VDDo and a voltage of the input signal transmitted to the pull-up node PU.

It will be noted that, the first pull-down node PDo does not represent a fixed physical structure, but represents a node having a specific voltage (here, being the voltage of the first pull-down node PDo), and any point having the specific voltage may be the first pull-down node PDo. In FIGS. 2A to 3B, the first pull-down node PDo is not limited to positions shown in the figures. For example, in a case where a resistance of a wire is not considered, any one of points on the wire coupled to the first pull-down node PDo shown in the figures may be the first pull-down node, and a voltage of the points is equal to the voltage of the first pull-down node PDo.

For example, as shown in FIGS. 3A and 3B, the first pull-down control sub-circuit 104 includes a fourth transistor M4, a fifth transistor M5, a sixth transistor M6, a seventh transistor M7 and a first control node P1.

A control electrode of the fourth transistor M4 is coupled to the second voltage signal terminal VDDo, a first electrode of the fourth transistor M4 is coupled to the second voltage signal terminal VDDo, and a second electrode of the fourth transistor M4 is coupled to the first control node P1. The fourth transistor M4 is configured to be turned on under the control of the second voltage signal to transmit the second voltage signal to the first control node P1.

A control electrode of the fifth transistor M5 is coupled to the pull-up node PU, a first electrode of the fifth transistor M5 is coupled to the first voltage signal terminal VSS1, and a second electrode of the fifth transistor M5 is coupled to the first control node P1. The fifth transistor M5 is configured to be turned on under the control of the voltage of the pull-up node PU to transmit the first voltage signal to the first control node P1.

A control electrode of the sixth transistor M6 is coupled to the first control node P1, a first electrode of the sixth transistor M6 is coupled to the second voltage signal terminal VDDo, and a second electrode of the sixth transistor M6 is coupled to the first pull-down node PDo. The sixth transistor M6 is configured to be turned on under control of a voltage of the first control node P1 to transmit the second voltage signal to the first pull-down node PDo.

A control electrode of the seventh transistor M7 is coupled to the pull-up node PU, a first electrode of the seventh transistor M7 is coupled to the first voltage signal terminal VSS1, and a second electrode of the seventh transistor M7 is coupled to the first pull-down node PDo. The seventh transistor M7 is configured to be turned on under the control of the voltage of the pull-up node PU to transmit the first voltage signal to the first pull-down node PDo.

It will be noted that, the first control node P1 does not represent a fixed physical structure, but represents a node having a specific voltage (here, being the voltage of the first control node P1), and any point having the specific voltage may be the first control node P1. In FIGS. 2A to 3B, the first control node P1 is not limited to positions shown in the figures. For example, in a case where a resistance of a wire is not considered, any one of points on the wire coupled to the first control node P1 shown in the figures may be the first control node, and a voltage of the points is equal to the voltage of the first control node P1.

In the above first pull-down control sub-circuit 104, in an example where the level of the first voltage signal transmitted by the first voltage signal terminal VSS1 continues to be the low level, the level of the second voltage signal transmitted by the second voltage signal terminal VDDo continues to be the high level, and the high level is the operation level that enables the transistor to be turned on, in a case where the voltage of the pull-up node PU is at the low level, the fourth transistor M4 is turned on under the control of the second voltage signal, and the fifth transistor M5 is turned off under the control of the voltage of the pull-up node PU. In this case, a level of the first control node P1 is the level of the second voltage signal, i.e., the high level. Thus, the sixth transistor M6 is turned on under the control of the voltage of the first control node P1, the seventh transistor M7 is turned off under the control of the voltage of the pull-up node PU, and the sixth transistor M6 transmits the second voltage signal received at the second voltage signal terminal VDDo to the first pull-down node PDo, so that the voltage of the first pull-down node PDo is raised.

In a case where the voltage of the pull-up node PU is at the high level, the fourth transistor M4 is turned on under the control of the second voltage signal, and the fifth transistor M5 is turned on under the control of the voltage of the pull-up node PU. In this case, the level of the first control node P1 is the level of the first voltage signal, i.e., the low level. Thus, the sixth transistor M6 is turned off under the control of the voltage of the first control node P1, the seventh transistor M7 is turned on under the control of the voltage of the pull-up node PU, and the seventh transistor M7 transmits the first voltage signal received at the first voltage signal terminal VSS1 to the first pull-down node PDo, so that the voltage of the first pull-down node PDo is pulled down.

In some embodiments, as shown in FIGS. 2A to 3B, the shift register RS further includes: an energy storage sub-circuit 201, a first output sub-circuit 105, a second noise reduction sub-circuit 106 and a reset sub-circuit 107.

The energy storage sub-circuit 201 is coupled to the pull-up node PU and the first output sub-circuit 105, and the energy storage sub-circuit 201 is configured to store the voltage of the input signal transmitted to the pull-up node PU.

The first output sub-circuit 105 is further coupled to a clock signal terminal CLK, the pull-up node PU and a first signal output terminal OUTPUT. The first output sub-circuit 105 is configured to transmit a clock signal received at the clock signal terminal CLK to the first signal output terminal OUTPUT and the energy storage sub-circuit 201 under the control of the voltage of the input signal transmitted to the pull-up node PU.

The second noise reduction sub-circuit 106 is coupled to the first pull-down node PDo, a third voltage signal terminal VSS2 and the first signal output terminal OUTPUT. The second noise reduction sub-circuit 106 is configured to transmit a third voltage signal received at the third voltage signal terminal VSS2 to the first signal output terminal OUTPUT under the control of the voltage of the first pull-down node PDo, so as to perform the noise reduction processing on the first signal output terminal OUTPUT.

The reset sub-circuit 107 is coupled to the pull-up node PU, the first voltage signal terminal VSS1 and a reset signal terminal RESET. The reset sub-circuit 107 is configured to transmit the first voltage signal received at the first voltage signal terminal VSS1 to the pull-up node PU in response to a reset signal received at the reset signal terminal RESET.

For example, as shown in FIGS. 3A and 3B, the first output sub-circuit 105 includes an eighth transistor M8. A control electrode of the eighth transistor M8 is coupled to the pull-up node PU, a first electrode of the eighth transistor M8 is coupled to the clock signal terminal CLK, and a second electrode of the eighth transistor M8 is coupled to the first signal output terminal OUTPUT. The eighth transistor M8 is configured to transmit the clock signal received at the clock signal terminal CLK to the first signal output terminal OUTPUT under the control of the voltage of the pull-up node PU.

The energy storage sub-circuit 201 includes a first capacitor. A first terminal of the first capacitor is coupled to the pull-up node PU, and a second terminal of the first capacitor is coupled to the second electrode of the eighth transistor M8.

The second noise reduction sub-circuit 106 includes a ninth transistor M9. A control electrode of the ninth transistor M9 is coupled to the first pull-down node PDo, a first electrode of the ninth transistor M9 is coupled to the third voltage signal terminal VSS2, and a second electrode of the ninth transistor M9 is coupled to the first signal output terminal OUTPUT. The ninth transistor M9 is configured to be turned on under the control of the voltage of the first pull-down node PDo to transmit the third voltage signal received at the third voltage signal terminal VSS2 to the first signal output terminal OUTPUT.

The reset sub-circuit 107 includes a tenth transistor M10. A control electrode of the tenth transistor M10 is coupled to the reset signal terminal RESET, a first electrode of the tenth transistor M10 is coupled to the first voltage signal terminal VSS1, and a second electrode of the tenth transistor M10 is coupled to the pull-up node PU. The tenth transistor M10 is configured to be turned on under control of the reset signal transmitted by the reset signal terminal RESET to transmit the first voltage signal received at the first voltage signal terminal VSS1 to the pull-up node PU.

Figure 2A:
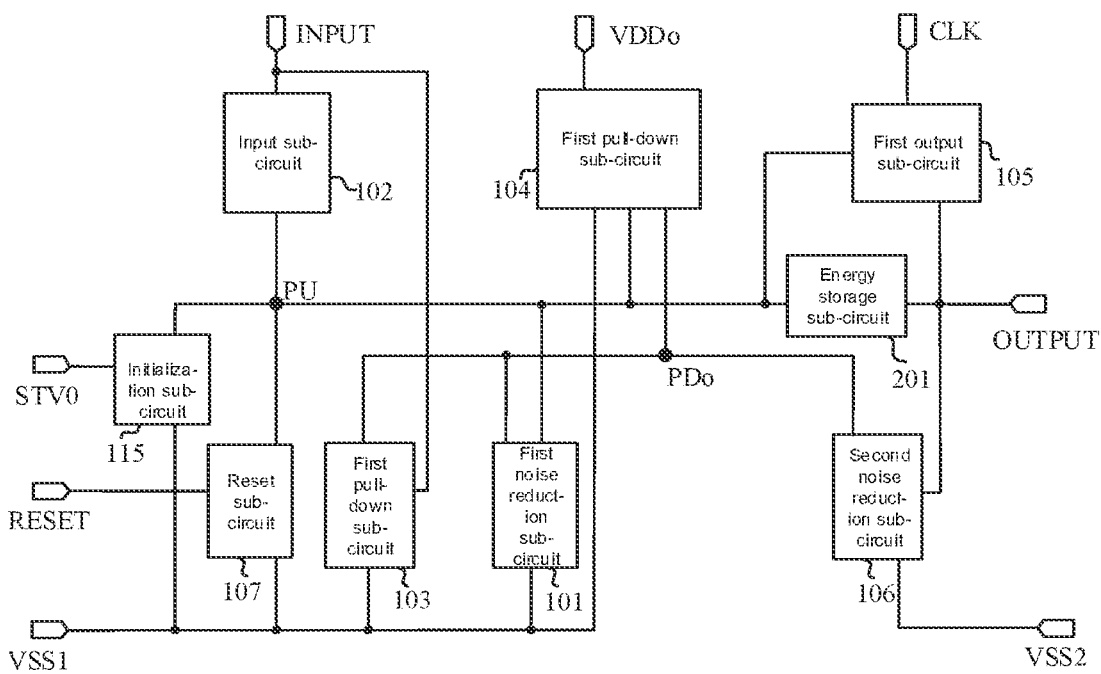
FIG. 2A is a structural diagram of a shift register, in accordance with some embodiments of the present disclosure.
Figure 2B:
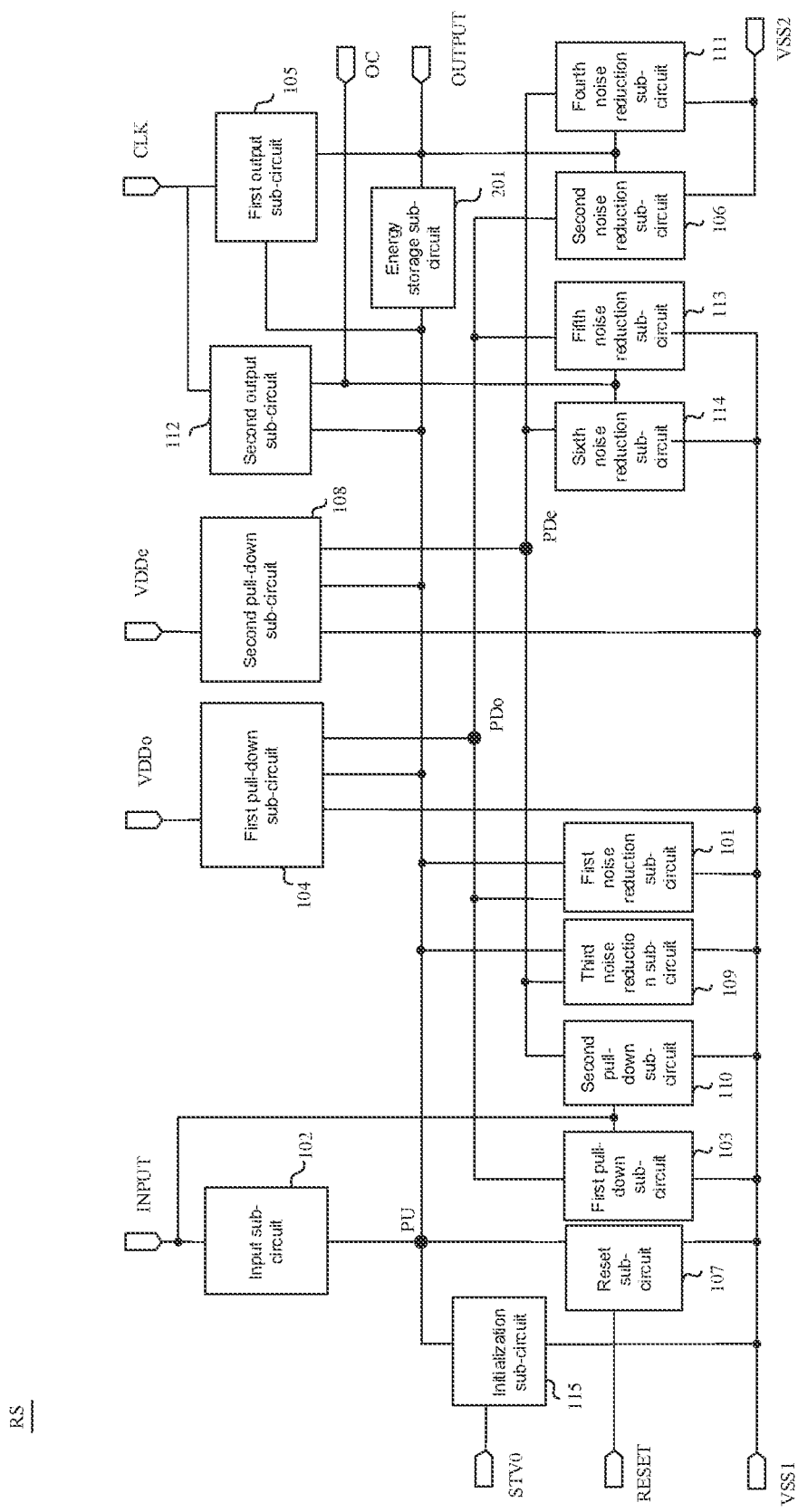
FIG. 2B is a structural diagram of another shift register, in accordance with some embodiments of the present disclosure.

In some embodiments, as shown in FIGS. 2B and 3B, the shift register RS further includes: a second pull-down node PDe, a second pull-down control sub-circuit 108, a third noise reduction sub-circuit 109 and a second pull-down sub-circuit 110.

The second pull-down control sub-circuit 108 is coupled to the first voltage signal terminal VSS1, a fourth voltage signal terminal VDDe, the pull-up node PU and the second pull-down node PDe.

The second pull-down control sub-circuit 108 is configured to: transmit a fourth voltage signal received at the fourth voltage signal terminal VDDe to the second pull-down node PDe in response to the fourth voltage signal received at the fourth voltage signal terminal VDDe and the voltage of the first voltage signal transmitted to the pull-up node PU; and transmit the first voltage signal received at the first voltage signal terminal VSS1 to the second pull-down node PDe in response to the fourth voltage signal received at the fourth voltage signal terminal VDDe and the voltage of the input signal transmitted to the pull-up node PU.

It will be noted that, the second pull-down node PDe does not represent a fixed physical structure, but represents a node having a specific voltage (here, being a voltage of the second pull-down node PDe), and any point having the specific voltage may be the second pull-down node PDe. In FIGS. 2B and 3B, the second pull-down node PDe is not limited to positions shown in the figures. For example, in a case where a resistance of a wire is not considered, any one of points on the wire coupled to the second pull-down node PDe shown in the figures may be the second pull-down node, and a voltage of the points is equal to the voltage of the second pull-down node PDe.

For example, as shown in FIG. 3B, the second pull-down control sub-circuit 108 includes an eleventh transistor M11, a twelfth transistor M12, a thirteenth transistor M13, a fourteenth transistor M14 and a second control node P2.

A control electrode of the eleventh transistor M11 is coupled to the fourth voltage signal terminal VDDe, a first electrode of the eleventh transistor M11 is coupled to the fourth voltage signal terminal VDDe, and a second electrode of the eleventh transistor M11 is coupled to the second control node P2. The eleventh transistor M11 is configured to be turned on under control of the fourth voltage signal transmitted by the fourth voltage signal terminal VDDe to transmit the fourth voltage signal to the second control node P2.

A control electrode of the twelfth transistor M12 is coupled to the pull-up node PU, a first electrode of the twelfth transistor M12 is coupled to the first voltage signal terminal VSS1, and a second electrode of the twelfth transistor M12 is coupled to the second control node P2. The twelfth transistor M12 is turned on under the control of the voltage of the pull-up node PU to transmit the first voltage signal received at the first voltage signal terminal VSS1 to the second control node P2.

A control electrode of the thirteenth transistor M13 is coupled to the second control node P2, a first electrode of the thirteenth transistor M13 is coupled to the fourth voltage signal terminal VDDe, and a second electrode of the thirteenth transistor M13 is coupled to the second pull-down node PDe. The thirteenth transistor M13 is turned on under control of a voltage of the second control node P2 to transmit the fourth voltage signal received at the fourth voltage signal terminal VDDe to the second pull-down node PDe.

A control electrode of the fourteenth transistor M14 is coupled to the pull-up node PU, a first electrode of the fourteenth transistor M14 is coupled to the first voltage signal terminal VSS1, and a second electrode of the fourteenth transistor M14 is coupled to the second pull-down node PDe. The fourteenth transistor M14 is turned on under the control of the voltage of the pull-up node PU to transmit the first voltage signal received at the first voltage signal terminal VSS1 to the second pull-down node PDe.

It will be noted that, the second control node P2 does not represent a fixed physical structure, but represents a node having a specific voltage (here, being a voltage of the second control node P2), and any point having the specific voltage may be the second control node P2. In FIG. 3B, the second control node P2 is not limited to positions shown in the figures. For example, in a case where a resistance of a wire is not considered, any one of points on the wire coupled to the second control node P2 shown in the figures may be the second control node, and a voltage of the points is equal to the voltage of the second control node P2.

In the above second pull-down control sub-circuit 108, in an example where the level of the first voltage signal transmitted by the first voltage signal terminal VSS1 continues to be the low level, a level of the fourth voltage signal transmitted by the fourth voltage signal terminal VDDe continues to be the high level, and the high level is the operation level that enables the transistor to be turned on, in the case where the voltage of the pull-up node PU is at the low level, the eleventh transistor M11 is turned on under the control of the fourth voltage signal, and the twelfth transistor M12 is turned off under the control of the voltage of the pull-up node PU. In this case, a level of the second control node P2 is the level of the fourth voltage signal, e.g., the high level. Thus, the thirteenth transistor M13 is turned on under the control of the voltage of the second control node P2, the fourteenth transistor M14 is turned off under the control of the voltage of the pull-up node PU, and the thirteenth transistor M13 transmits the fourth voltage signal received at the fourth voltage signal terminal VDDe to the second pull-down node PDe, so that the voltage of the second pull-down node PDe is raised.

In the case where the voltage of the pull-up node PU is at the high level, the eleventh transistor M11 is turned on under the control of the fourth voltage signal, and the twelfth transistor M12 is turned on under the control of the voltage of the pull-up node PU. In this case, the level of the second control node P2 is the level of the first voltage signal, e.g., the low level. Thus, the thirteenth transistor M13 is turned off under the control of the voltage of the second control node P2, the fourteenth transistor M14 is turned on under the control of the voltage of the pull-up node PU, and the fourteenth transistor M14 transmits the first voltage signal received at the first voltage signal terminal VSS1 to the second pull-down node PDe, so that the voltage of the second pull-down node PDe is pulled down.

The third noise reduction sub-circuit 109 is coupled to the pull-up node PU, the second pull-down node PDe and the first voltage signal terminal VSS1. The third noise reduction sub-circuit 109 is configured to transmit the first voltage signal received at the first voltage signal terminal VSS1 to the pull-up node PU under control of a voltage of the fourth voltage signal transmitted to the second pull-down node PDe.

The second pull-down sub-circuit 110 is coupled to the signal input terminal INPUT, the second pull-down node PDe and the first voltage signal terminal VSS1. The second pull-down sub-circuit 110 is configured to transmit the first voltage signal received at the first voltage signal terminal VSS1 to the second pull-down node PDe in response to the input signal received at the signal input terminal INPUT, so that the third noise reduction sub-circuit 109 is turned off under control of the voltage of the first voltage signal transmitted to the second pull-down node PDe to stop transmitting the first voltage signal to the pull-up node PU.

In the above shift register RS, sub-circuits related to the first pull-down node PDo are the first pull-down control sub-circuit 104, the first pull-down sub-circuit 103, the first noise reduction sub-circuit 101, the second noise reduction sub-circuit 106 (and a fifth noise reduction sub-circuit 113 that will be described later). Sub-circuits related to the second pull-down node PDe are the second pull-down control sub-circuit 108, the second pull-down sub-circuit 110, the third noise reduction sub-circuit 109 (and a fourth noise reduction sub-circuit 111 and a sixth noise reduction sub-circuit 114 that will be described later). The first pull-down control sub-circuit 104 is used to control a voltage change of the first pull-down node PDo, and the second pull-down control sub-circuit 108 is used to control a voltage change of the second pull-down node PDe. The first pull-down sub-circuit 103 and the second pull-down sub-circuit 110 are used to transmit the first voltage signal to the first pull-down node PDo and the second pull-down node PDe, respectively. The first noise reduction sub-circuit 101 and the third noise reduction sub-circuit 109 are both used to perform noise reduction on the pull-up node PU, the second noise reduction sub-circuit 106 and the fourth noise reduction sub-circuit 111 are both used to perform noise reduction on the first signal output terminal OUTPUT, and the fifth noise reduction sub-circuit 113 and the sixth noise reduction sub-circuit 114 are both used to perform noise reduction on a second signal output terminal OC (mentioned later).

Figure 5:
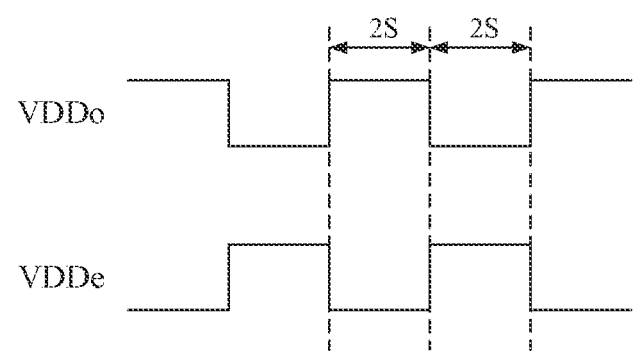
FIG. 5 is a timing diagram of signals transmitted by a second voltage signal terminal and a fourth voltage signal terminal of a shift register, in accordance with some embodiments of the present disclosure.

That is, the sub-circuits related to the first pull-down node PDo and the sub-circuits related to the second pull-down node PDe may be regarded as two sets of sub-circuits corresponding to each other. In this way, levels of the second voltage signal transmitted by the second voltage signal terminal VDDo and levels of the fourth voltage signal transmitted by the fourth voltage signal terminal VDDe may be set to alternate between the high level and the low level (for example, as shown in FIG. 5, interval time for the levels of the second voltage signal and the levels of the fourth voltage signal to alternate between the high level and the low level is 2 s), so that the sub-circuits related to the first pull-down node PDo and the sub-circuits related to the second pull-down node PDe may operate and rest alternately. Therefore, it is possible to avoid a problem of shortening a service life of the sub-circuit caused by continuous operation of the sub-circuit, and prolonging the service life of the sub-circuit. It will be noted that, the interval time for the levels of the second voltage signal and the levels of the fourth voltage signal to alternate between the high level and the low level may be set according to requirements, and the interval time may be, for example, 1 s, 1.5 s or the like.

For example, as shown in FIG. 3B, the third noise reduction sub-circuit 109 includes a fifteenth transistor M15. A control electrode of the fifteenth transistor M15 is coupled to the second pull-down node PDe, a first electrode of the fifteenth transistor M15 is coupled to the first voltage signal terminal VSS1, and a second electrode of the fifteenth transistor M15 is coupled to the pull-up node PU. The fifteenth transistor M15 is configured to be turned on under the control of the second pull-down node PDe to transmit the first voltage signal received at the first voltage signal terminal VSS1 to the pull-up node PU, so as to perform the noise reduction processing on the pull-up node PU.

The second pull-down sub-circuit 110 includes a sixteenth transistor M16. A control electrode of the sixteenth transistor M16 is coupled to the signal input terminal INPUT, a first electrode of the sixteenth transistor M16 is coupled to the first voltage signal terminal VSS1, and a second electrode of the sixteenth transistor M16 is coupled to the second pull-down node PDe. The sixteenth transistor M16 is configured to be turned on under the control of the input signal transmitted by the signal input terminal INPUT to transmit the first voltage signal received at the first voltage signal terminal VSS1 to the second pull-down node PDe.

In some embodiments, as shown in FIGS. 2B and 3B, the shift register RS further includes the fourth noise reduction sub-circuit 111.

The fourth noise reduction sub-circuit 111 is coupled to the second pull-down node PDe, the third voltage signal terminal VSS2 and the first signal output terminal OUTPUT. The fourth noise reduction sub-circuit 111 is configured to transmit the third voltage signal received at the third voltage signal terminal VSS2 to the first signal output terminal OUTPUT under the control of the voltage of the fourth voltage signal transmitted to the second pull-down node PDe.

For example, as shown in FIG. 3B, the fourth noise reduction sub-circuit 111 includes a seventeenth transistor M17. A control electrode of the seventeenth transistor M17 is coupled to the second pull-down node PDe, a first electrode of the seventeenth transistor M17 is coupled to the third voltage signal terminal VSS2, and a second electrode of the seventeenth transistor M17 is coupled to the first signal output terminal OUTPUT. The seventeenth transistor M17 is configured to be turned on under the control of the second pull-down node PDe to transmit the third voltage signal received at the third voltage signal terminal VSS2 to the first signal output terminal OUTPUT.

In some embodiments, as shown in FIGS. 2B and 3B, the shift register RS further includes: a second output sub-circuit 112, the fifth noise reduction sub-circuit 113 and the sixth noise reduction sub-circuit 114.

The second output sub-circuit 112 is coupled to the pull-up node PU, the clock signal terminal CLK and the second signal output terminal OC. The second output sub-circuit 112 is configured to transmit the clock signal received at the clock signal terminal CLK to the second signal output terminal OC under the control of the voltage of the input signal transmitted to the pull-up node PU.

The fifth noise reduction sub-circuit 113 is coupled to the first pull-down node PDo, the first voltage signal terminal VSS1 and the second signal output terminal OC. The fifth noise reduction sub-circuit 113 is configured to transmit the first voltage signal received at the first voltage signal terminal VSS1 to the second signal output terminal OC under the control of the voltage of the second voltage signal transmitted to the first pull-down node PDo.

The sixth noise reduction sub-circuit 114 is coupled to the second pull-down node PDe, the first voltage signal terminal VSS1 and the second signal output terminal OC, The sixth noise reduction sub-circuit 114 is configured to transmit the first voltage signal received at the first voltage signal terminal VSS1 to the second signal output terminal OC under the control of the voltage of the fourth voltage signal transmitted to the second pull-down node PDe.

The shift register RS provided in some embodiments of the present disclosure includes the first output sub-circuit 105 and the second output sub-circuit 112, and the first output sub-circuit 105 and the second output sub-circuit 112 output the clock signal to the first signal output terminal OUTPUT and the second signal output terminal OC, respectively. In the gate drive circuit, the gate drive circuit includes a plurality of shift registers RS, and adjacent shift registers RS need to be cascaded; thus, one of the first signal output terminal OUTPUT and the second signal output terminal OC may be coupled to the gate line to serve as a port for outputting a gate scanning signal to a display area of the display panel (for example, the first signal output terminal OUTPUT is coupled to the gate line), and the other of the first signal output terminal OUTPUT and the second signal output terminal OC serves as a port for coupling when the adjacent shift registers RS are cascaded. For example, a signal input terminal INPUT of an any-stage shift register RS except a first-stage shift register RS is coupled to a second signal output terminal OC of a previous-stage shift register RS of the any-stage shift register RS.

In this way, by providing two signal output terminals whose functions are different, it may be possible to avoid an influence of a load of the gate line on the signal (e.g., a delay or a loss of the signal), thereby avoiding affecting an accuracy of an input signal or a reset signal of a cascaded shift register RS, and ensuring the normal operation of the shift register RS.

For example, as shown in FIG. 3B, the second output sub-circuit 112 includes an eighteenth transistor M18. A control electrode of the eighteenth transistor M18 is coupled to the pull-up node PU, a first electrode of the eighteenth transistor M18 is coupled to the clock signal terminal CLK, and a second electrode of the eighteenth transistor M18 is coupled to the second signal output terminal OC. The eighteenth transistor M18 is configured to be turned on under the control of the voltage of the pull-up node PU to transmit the clock signal received at the clock signal terminal CLK to the second signal output terminal OC.

The fifth noise reduction sub-circuit 113 includes a nineteenth transistor M19. A control electrode of the nineteenth transistor M19 is coupled to the first pull-down node PDo, a first electrode of the nineteenth transistor M19 is coupled to the first voltage signal terminal VSS1, and a second electrode of the nineteenth transistor M19 is coupled to the second signal output terminal OC. The nineteenth transistor M19 is configured to be turned on under the control of the first pull-down node PDo to transmit the first voltage signal received at the first voltage signal terminal VSS1 to the second signal output terminal OC.

The sixth noise reduction sub-circuit 114 includes a twentieth transistor M20. A control electrode of the twentieth transistor M20 is coupled to the second pull-down node PDe, a first electrode of the twentieth transistor M20 is coupled to the first voltage signal terminal VSS1, and a second electrode of the twentieth transistor M20 is coupled to the second signal output terminal OC. The twentieth transistor M20 is configured to be turned on under the control of the second pull-down node PDe to transmit the first voltage signal received at the first voltage signal terminal VSS1 to the second signal output terminal OC.

In some embodiments, as shown in FIGS. 2A to 3B, the shift register RS further includes an initialization sub-circuit 115. The initialization sub-circuit 115 is coupled to the pull-up node PU, an initialization signal terminal STV0 and the first voltage signal terminal VSS1. The initialization sub-circuit 115 is configured to transmit the first voltage signal received at the first voltage signal terminal VSS1 to the pull-up node PU in response to an initialization signal received at the initialization signal terminal STV0.

For example, as shown in FIGS. 3A and 3B, the initialization sub-circuit 115 includes a twenty-first transistor M21. A control electrode of the twenty-first transistor M21 is coupled to the initialization signal terminal STV0, a first electrode of the twenty-first transistor M21 is coupled to the first voltage signal terminal VSS1, and a second electrode of the twenty-first transistor M21 is coupled to the pull-up node PU. The twenty-first transistor M21 is configured to be turned on under control of the initialization signal transmitted by the initialization signal terminal STV0 to transmit the first voltage signal received at the first voltage signal terminal VSS1 to the pull-up node PU.

On this basis, a specific circuit structure of the shift register RS provided in the embodiments of the present disclosure will be integrally and exemplarily introduced below.

As shown in FIG. 3B, the shift register RS includes: the pull-up node PU, the first pull-down node PDo, the second pull-down node PDe, the first noise reduction sub-circuit 101, the input sub-circuit 102, the first pull-down sub-circuit 103, the first pull-down control sub-circuit 104, the first output sub-circuit 105, the energy storage sub-circuit 201, the second noise reduction sub-circuit 106, the reset sub-circuit 107, the second pull-down control sub-circuit 108, the third noise reduction sub-circuit 109, the second pull-down sub-circuit 110, the fourth noise reduction sub-circuit 111, the second output sub-circuit 112, the fifth noise reduction sub-circuit 113, the sixth noise reduction sub-circuit 114 and the initialization sub-circuit 115.

The first noise reduction sub-circuit 101 includes the first transistor M1, the input sub-circuit 102 includes the second transistor M2, the first pull-down sub-circuit 103 includes the third transistor M3, and the first pull-down control sub-circuit 104 includes the fourth transistor M4, the fifth transistor M5, the sixth transistor M6, the seventh transistor M7 and the first control node P1.

The first output sub-circuit 105 includes the eighth transistor M8, the energy storage sub-circuit 201 includes the first capacitor, the second noise reduction sub-circuit 106 includes the ninth transistor M9, and the reset sub-circuit 107 includes the tenth transistor M10.

The second pull-down control sub-circuit 108 includes the eleventh transistor M11, the twelfth transistor M12, the thirteenth transistor M13, the fourteenth transistor M14 and the second control node P2; the third noise reduction sub-circuit 109 includes the fifteenth transistor M15; the second pull-down sub-circuit 110 includes the sixteenth transistor M16; and the fourth noise reduction sub-circuit 111 includes the seventeenth transistor M17.

The second output sub-circuit 112 includes the eighteenth transistor M18, the fifth noise reduction sub-circuit 113 includes the nineteenth transistor M19, the sixth noise reduction sub-circuit 114 includes the twentieth transistor M20, and the initialization sub-circuit 115 includes the twenty-first transistor M21.

The control electrode of the first transistor M1 is coupled to the first pull-down node PDo, the first electrode of the first transistor M1 is coupled to the first voltage signal terminal VSS1, and the second electrode of the first transistor M1 is coupled to the pull-up node PU. The first transistor M1 is configured to be turned on under the control of the voltage of the first pull-down node PDo to transmit the first voltage signal received at the first voltage signal terminal VSS1 to the pull-up node PU.

The control electrode of the second transistor M2 is coupled to the signal input terminal INPUT, the first electrode of the second transistor M2 is coupled to the signal input terminal INPUT, and the second electrode of the second transistor M2 is coupled to the pull-up node PU. The second transistor M2 is configured to be turned on under the control of the input signal to transmit the input signal to the pull-up node PU, so as to charge the pull-up node PU.

The control electrode of the third transistor M3 is coupled to the signal input terminal INPUT, the first electrode of the third transistor M3 is coupled to the first voltage signal terminal VSS1, and the second electrode of the third transistor M3 is coupled to the first pull-down node PDo. The third transistor M3 is configured to be turned on under the control of the input signal to transmit the first voltage signal received at the first voltage signal terminal VSS1 to the first pull-down node PDo.

The control electrode of the fourth transistor M4 is coupled to the second voltage signal terminal VDDo, the first electrode of the fourth transistor M4 is coupled to the second voltage signal terminal VDDo, and the second electrode of the fourth transistor M4 is coupled to the first control node P1. The fourth transistor M4 is configured to be turned on under the control of the second voltage signal to transmit the second voltage signal to the first control node P1.

The control electrode of the fifth transistor M5 is coupled to the pull-up node PU, the first electrode of the fifth transistor M5 is coupled to the first voltage signal terminal VSS1, and the second electrode of the fifth transistor M5 is coupled to the first control node P1. The fifth transistor M5 is configured to be turned on under the control of the voltage of the pull-up node PU to transmit the first voltage signal to the first control node P1.

The control electrode of the sixth transistor M6 is coupled to the first control node P1, the first electrode of the sixth transistor M5 is coupled to the second voltage signal terminal VDDo, and the second electrode of the sixth transistor M6 is coupled to the first pull-down node PDo. The sixth transistor M5 is configured to be turned on under the control of the voltage of the first control node P1 to transmit the second voltage signal to the first pull-down node PDo.

The control electrode of the seventh transistor M7 is coupled to the pull-up node PU, the first electrode of the seventh transistor M7 is coupled to the first voltage signal terminal VSS1, and the second electrode of the seventh transistor M7 is coupled to the first pull-down node PDo. The seventh transistor M7 is configured to be turned on under the control of the voltage of the pull-up node PU to transmit the first voltage signal to the first pull-down node PDo.

The control electrode of the eighth transistor M8 is coupled to the pull-up node PU, the first electrode of the eighth transistor M8 is coupled to the clock signal terminal CLK, and the second electrode of the eighth transistor M8 is coupled to the first signal output terminal OUTPUT. The eighth transistor M8 is configured to transmit the clock signal received at the clock signal terminal CLK to the first signal output terminal OUTPUT under the control of the voltage of the pull-up node PU.

The first terminal of the first capacitor is coupled to the pull-up node PU, and the second terminal of the first capacitor is coupled to the second electrode of the eighth transistor M8.

The control electrode of the ninth transistor M9 is coupled to the first pull-down node PDo, the first electrode of the ninth transistor M9 is coupled to the third voltage signal terminal VSS2, and the second electrode of the ninth transistor M9 is coupled to the first signal output terminal OUTPUT. The ninth transistor M9 is configured to be turned on under the control of the voltage of the first pull-down node PDo to transmit the third voltage signal received at the third voltage signal terminal VSS2 to the first signal output terminal OUTPUT.

The control electrode of the tenth transistor M10 is coupled to the reset signal terminal RESET, the first electrode of the tenth transistor M10 is coupled to the first voltage signal terminal VSS1, and the second electrode of the tenth transistor M10 is coupled to the pull-up node PU. The tenth transistor M10 is configured to be turned on under the control of the reset signal transmitted by the reset signal terminal RESET to transmit the first voltage signal received at the first voltage signal terminal VSS1 to the pull-up node PU.

The control electrode of the eleventh transistor M11 is coupled to the fourth voltage signal terminal VDDe, the first electrode of the eleventh transistor M11 is coupled to the fourth voltage signal terminal VDDe, and the second electrode of the eleventh transistor M11 is coupled to the second control node P2. The eleventh transistor M11 is configured to be turned on under the control of the fourth voltage signal transmitted by the fourth voltage signal terminal VDDe to transmit the fourth voltage signal to the second control node P2.

The control electrode of the twelfth transistor M12 is coupled to the pull-up node PU, the first electrode of the twelfth transistor M12 is coupled to the first voltage signal terminal VSS1, and the second electrode of the twelfth transistor M12 is coupled to the second control node P2. The twelfth transistor M12 is turned on under the control of the voltage of the pull-up node PU to transmit the first voltage signal received at the first voltage signal terminal VSS1 to the second control node P2.

The control electrode of the thirteenth transistor M13 is coupled to the second control node P2, the first electrode of the thirteenth transistor M13 is coupled to the fourth voltage signal terminal VDDe, and the second electrode of the thirteenth transistor M13 is coupled to the second pull-down node PDe. The thirteenth transistor M13 is turned on under the control of the voltage of the second control node P2 to transmit the fourth voltage signal received at the fourth voltage signal terminal VDDe to the second pull-down node PDe.

The control electrode of the fourteenth transistor M14 is coupled to the pull-up node PU, the first electrode of the fourteenth transistor M14 is coupled to the first voltage signal terminal VSS1, and the second electrode of the fourteenth transistor M14 is coupled to the second pull-down node PDe. The fourteenth transistor M14 is turned on under the control of the voltage of the pull-up node PU to transmit the first voltage signal received at the first voltage signal terminal VSS1 to the second pull-down node PDe.

The control electrode of the fifteenth transistor M15 is coupled to the second pull-down node PDe, the first electrode of the fifteenth transistor M15 is coupled to the first voltage signal terminal VSS1, and the second electrode of the fifteenth transistor M15 is coupled to the pull-up node PU. The fifteenth transistor M15 is configured to be turned on under the control of the second pull-down node PDe to transmit the first voltage signal received at the first voltage signal terminal VSS1 to the pull-up node PU, so as to perform the noise reduction processing on the pull-up node PU.

The control electrode of the sixteenth transistor M16 is coupled to the signal input terminal INPUT, the first electrode of the sixteenth transistor M16 is coupled to the first voltage signal terminal VSS1, and the second electrode of the sixteenth transistor M16 is coupled to the second pull-down node PDe. The sixteenth transistor M16 is configured to be turned on under the control of the input signal transmitted by the signal input terminal INPUT to transmit the first voltage signal received at the first voltage signal terminal VSS1 to the second pull-down node PDe.

The control electrode of the seventeenth transistor M17 is coupled to the second pull-down node PDe, the first electrode of the seventeenth transistor M17 is coupled to the third voltage signal terminal VSS2, and the second electrode of the seventeenth transistor M17 is coupled to the first signal output terminal OUTPUT. The seventeenth transistor M17 is configured to be turned on under the control of the second pull-down node PDe to transmit the third voltage signal received at the third voltage signal terminal VSS2 to the first signal output terminal OUTPUT.

The control electrode of the eighteenth transistor M18 is coupled to the pull-up node PU, the first electrode of the eighteenth transistor M18 is coupled to the clock signal terminal CLK, and the second electrode of the eighteenth transistor M18 is coupled to the second signal output terminal OC. The eighteenth transistor M18 is configured to be turned on under the control of the voltage of the pull-up node PU to transmit the dock signal received at the dock signal terminal CLK to the second signal output terminal OC.

The control electrode of the nineteenth transistor M19 is coupled to the first pull-down node PDo, the first electrode of the nineteenth transistor M19 is coupled to the first voltage signal terminal VSS1, and the second electrode of the nineteenth transistor M19 is coupled to the second signal output terminal OC. The nineteenth transistor M19 is configured to be turned on under the control of the first pull-down node PDo to transmit the first voltage signal received at the first voltage signal terminal VSS1 to the second signal output terminal OC.

The control electrode of the twentieth transistor M20 is coupled to the second pull-down node PDe, the first electrode of the twentieth transistor M20 is coupled to the first voltage signal terminal VSS1, and the second electrode of the twentieth transistor M20 is coupled to the second signal output terminal OC. The twentieth transistor M20 is configured to be turned on under the control of the second pull-down node PDe to transmit the first voltage signal received at the first voltage signal terminal VSS1 to the second signal output terminal OC.

The control electrode of the twenty-first transistor M21 is coupled to the initialization signal terminal STV0, the first electrode of the twenty-first transistor M21 is coupled to the first voltage signal terminal VSS1, and the second electrode of the twenty-first transistor M21 is coupled to the pull-up node PU. The twenty-first transistor M21 is configured to be turned on under the control of the initialization signal transmitted by the initialization signal terminal STV0 to transmit the first voltage signal received at the first voltage signal terminal VSS1 to the pull-up node PU.

It will be noted that the transistor used in the shift register RS provided in the embodiments of the present disclosure may be an N-type transistor or a P-type transistor. For example, the transistors in the shift register RS provided in the embodiments of the present disclosure are all N-type transistors. The transistor used in the shift register RS provided in the embodiments of the present disclosure may be an enhancement-type transistor, a depletion-type transistor or any other switching device with the same property. The transistor may also be an amorphous silicon thin film transistor, a polycrystalline silicon thin film transistor or an amorphous indium gallium zinc oxide thin film transistor, and the embodiments of the present disclosure are not limited thereto.

Moreover, the control electrode of the transistor in the shift register RS is a gate of the transistor, the first electrode of the transistor may be a source, and the second electrode of the transistor may be a drain; alternatively, the first electrode of the transistor may be the drain, and the second electrode of the transistor may be the source, and the embodiments of the present disclosure are not limited thereto. Since the source and the drain of the transistor may be symmetrical in structure, the source and the drain thereof may be indistinguishable in structure. That is, the first electrode and the second electrode of the transistor in the embodiments of the present disclosure may be indistinguishable in structure. For example, in a case where the transistor is the P-type transistor, the first electrode of the transistor is the source, and the second electrode of the transistor is the drain. For example, in a case where the transistor is the N-type transistor, the first electrode of the transistor is the drain, and the second electrode of the transistor is the source.

In the embodiments of the present disclosure, "high voltage" and "low voltage", "high potential" and "low potential", and "high level" and "low level" are relative. For example, in a case where the transistor included in the shift register is the N-type transistor, a voltage that enables the transistor to be turned on is referred to as the high voltage (the high potential, or the high level), and a voltage that is unable to make the transistor be turned on is referred to as the low voltage (the low potential, or the low level). Alternatively, in a case where the transistor included in the shift register is the P-type transistor, a voltage that is unable to make the transistor be turned on is referred to as the high voltage (the high potential, or the high level), and a voltage that enables the transistor to be turned on is referred to as the low voltage (the low potential, or the low level).

Figure 6A:
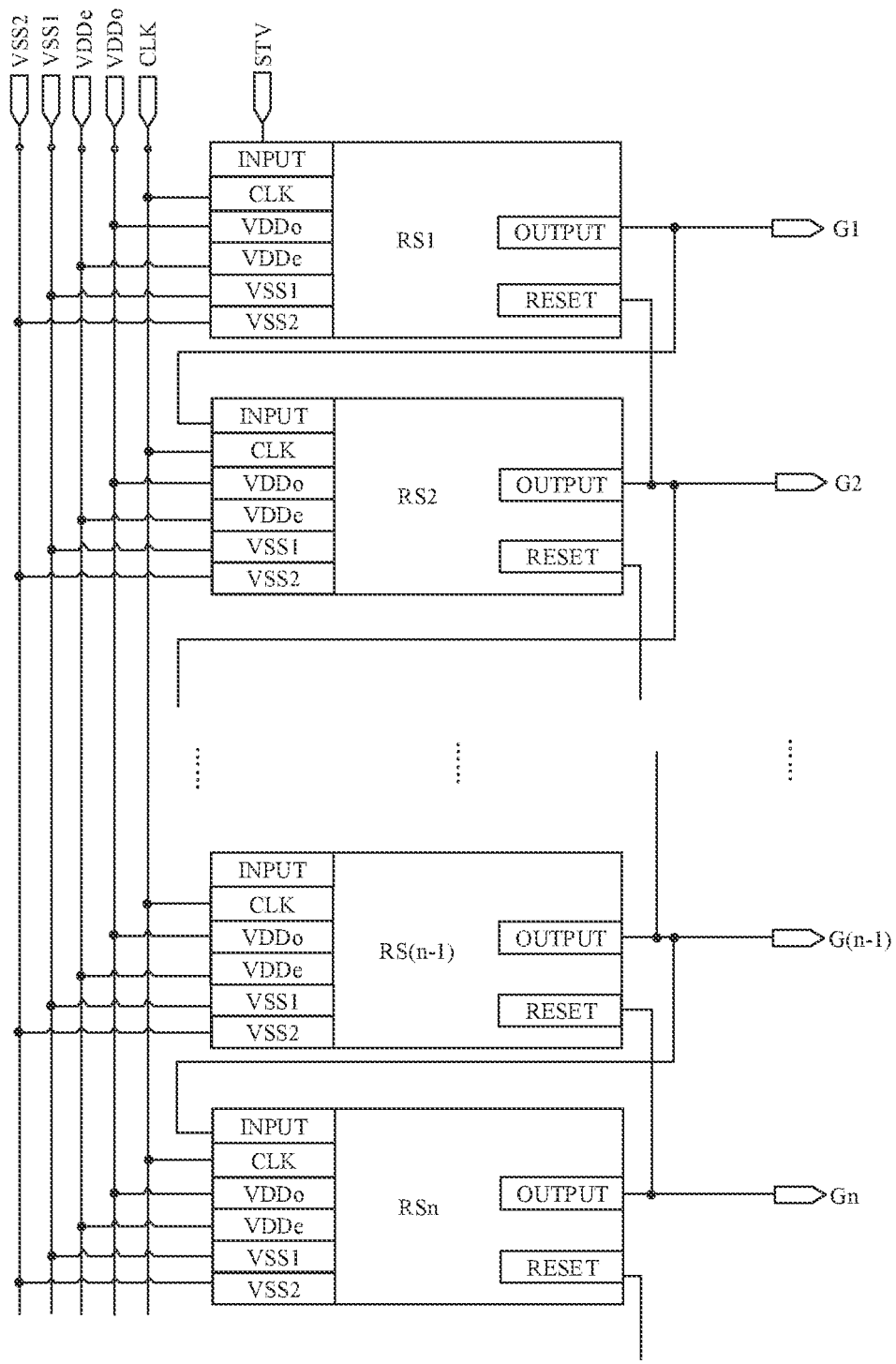
FIG. 6A is a structural diagram of a gate drive circuit, in accordance with some embodiments of the present disclosure.
Figure 6B:
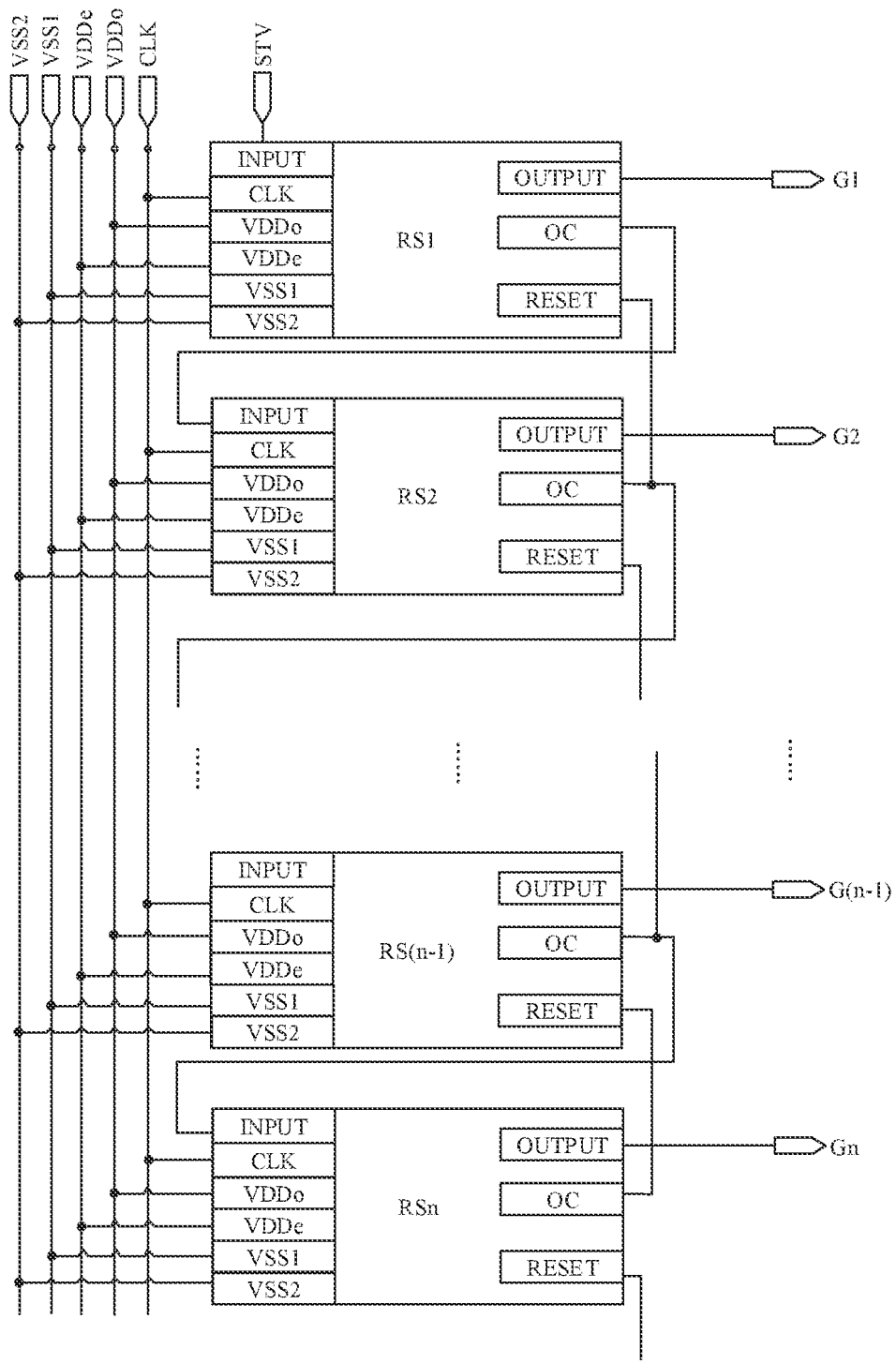
FIG. 6B is a structural diagram of another gate drive circuit, in accordance with some embodiments of the present disclosure.

Some embodiments of the present disclosure further provide a gate drive circuit 01. As shown in FIGS. 6A and 6B, the gate drive circuit 01 includes at least two cascaded shift registers RS as provided in the above embodiments of the present disclosure. For example, the gate drive circuit 01 includes n cascaded shift registers RS as described above, which are RS1 to RSn.

For the shift register RS (i.e., including only one output sub-circuit) as shown in FIGS. 2A and 3A, in some embodiments, as shown in FIG. 6A, in the gate drive circuit 01, a signal input terminal INPUT of the first-stage shift register RS1 is coupled to a start signal terminal STV.

The signal input terminal INPUT of the any-stage shift register RS except the first-stage shift register RS1 is coupled to a first signal output terminal OUTPUT of the previous-stage shift register RS of the any-stage shift register RS. For example, a signal input terminal INPUT of a second-stage shift register RS2 is coupled to a first signal output terminal OUTPUT of the first-stage shift register RS1. A signal input terminal INPUT of a third-stage shift register RS3 is coupled to a first signal output terminal OUTPUT of the second-stage shift register RS2.

A reset signal terminal RESET of the any-stage shift register RS except a last-stage shift register RSn is coupled to a first signal output terminal OUTPUT of a next-stage shift register RS of the any-stage shift register RS. For example, a reset signal terminal RESET of the second-stage shift register RS2 is coupled to a first signal output terminal OUTPUT of the third-stage shift register RS3. A reset signal terminal RESET of the third-stage shift register RS3 is coupled to a first signal output terminal OUTPUT of a fourth-stage shift register RS4.

A reset signal terminal RESET of the last-stage shift register RSn is coupled to a signal terminal separately provided for outputting the reset signal, or is coupled to the start signal terminal STV. (FIG. 6A is only schematically illustrated by considering an example in which the reset signal terminal RESET of the last-stage shift register RSn is coupled to the signal terminal separately provided for outputting the reset signal).

In some embodiments, for the shift register RS as shown in FIGS. 2B and 3B (i.e., in a case where the shift register RS further includes the second output sub-circuit 112, the fifth noise reduction sub-circuit 113 and the sixth noise reduction sub-circuit 114), in the gate drive circuit 01, the signal input terminal INPUT of the first-stage shift register RS1 is coupled to the start signal terminal STV.

The signal input terminal INPUT of the any-stage shift register RS except the first-stage shift register RS1 is coupled to a second signal output terminal OC of the previous-stage shift register RS of the any-stage shift register RS. For example, the signal input terminal INPUT of the second-stage shift register RS2 is coupled to a second signal output terminal OC of the first-stage shift register RS1. The signal input terminal INPUT of the third-stage shift register RS3 is coupled to a second signal output terminal OC of the second-stage shift register RS2.

The reset signal terminal RESET of the any-stage shift register RS except the last-stage shift register RSn is coupled to a second signal output terminal OC of the next-stage shift register RS of the any-stage shift register RS. For example, the reset signal terminal RESET of the second-stage shift register RS2 is coupled to a second signal output terminal OC of the third-stage shift register RS3. The reset signal terminal RESET of the third-stage shift register RS3 is coupled to a second signal output terminal OC of the fourth-stage shift register RS4.

The reset signal terminal RESET of the last-stage shift register RSn is coupled to a signal terminal separately provided for outputting the reset signal, or is coupled to the start signal terminal STV. (FIG. 6B is only schematically illustrated by considering an example in which the reset signal terminal RESET of the last-stage shift register RSn is coupled to the signal terminal separately provided for outputting the reset signal).

The first signal output terminal OUTPUT of each shift register RS is coupled to a single gate line. The first signal output terminal OUTPUT is configured to output the gate scanning signal to the gate line to drive the gate line.

It will be understood that, in the above embodiments, for the shift register RS as shown in FIGS. 2B and 3B, the second signal output terminal OC of each shift register RS may be coupled to a single gate line, the first signal output terminal OUTPUT serves as the port for cascading the adjacent shift register RS, and the embodiments of the present disclosure is not limited thereto.

Since the gate drive circuit 01 provided in the embodiments of the present disclosure includes the shift register RS as described above, it has the same beneficial effects as the shift register RS provided in the foregoing embodiments. The foregoing embodiments have described the structure and the beneficial effects of the shift register RS in detail, which will not be repeated here.

In addition, for the gate drive circuit 01 shown in FIG. 6B, one of the first signal output terminal OUTPUT and the second signal output terminal OC of the shift register RS is coupled to the gate line to serve as the port for outputting the gate scanning signal to the display area of the display panel, and the other of the first signal output terminal OUTPUT and the second signal output terminal OC serves as the port for coupling when the adjacent shift registers RS are cascaded. In this way, by providing the two signal output terminals whose functions are different, it may be possible to avoid the influence of the load of the gate line on the signal (e.g., the delay or the loss of the signal), thereby avoid affecting the accuracy of the input signal or the reset signal of the cascaded shift register RS and the normal operation of the shift register RS.

Figure 7:
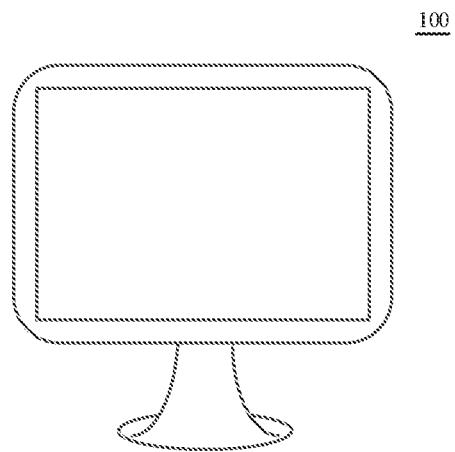
FIG. 7 is a structural diagram of a display apparatus, in accordance with some embodiments of the present disclosure.

As shown in FIG. 7, some embodiments of the present disclosure further provide a display apparatus 100. The display apparatus 100 includes the above gate drive circuit 01 provided in the embodiments of the present disclosure, i.e., includes the above shift register RS. The display apparatus 100 has the same beneficial effects as the shift register RS provided in the foregoing embodiments. The foregoing embodiments have described the structure and the beneficial effects of the shift register RS in detail, which will not be repeated here.

In some examples, the display apparatus 100 provided in the embodiments of the present disclosure is a liquid crystal display apparatus; or the display apparatus 100 provided in the embodiments of the present disclosure is an organic light-emitting diode display apparatus including an organic light-emitting diode display panel. The display apparatus provided in the embodiments of the present disclosure may be any product or component having a display function, such as a liquid crystal panel, an electronic paper, an organic light-emitting diode (OLED) panel, a mobile phone, a tablet computer, a television, a display, a notebook computer, a digital photo frame, a navigator or the like, and the present disclosure is not limited thereto.

Some embodiments of the present disclosure further provide a drive method of the gate drive circuit, and the drive method is applied to the gate drive circuit as described above. As shown in FIGS. 2A to 3B and 4, the drive method includes a noise reduction phase S1 and a charging phase S2 included in a frame period for each shift register RS in the gate drive circuit 01.

The noise reduction phase S1 includes:

the first noise reduction sub-circuit 101 transmitting the first voltage signal received at the first voltage signal terminal VSS1 to the pull-up node PU after the first noise reduction sub-circuit 101 is turned on under the control of the voltage of the first pull-down node PDo.

For example, as shown in FIGS. 3A and 3B, in a case where the first noise reduction sub-circuit 101 includes the first transistor M1, the noise reduction phase S1 includes: the first transistor M1 transmitting the first voltage signal received at the first voltage signal terminal VSS1 to the pull-up node PU after the first transistor M1 is turned on under the control of the voltage of the first pull-down node PDo, so as to perform the noise reduction processing on the pull-up node PU.

The charging phase S2 includes:

the input sub-circuit 102 transmitting the input signal received at the signal input terminal INPUT to the pull-up node PU after the input sub-circuit 102 is turned on under the control of the input signal transmitted by the signal input terminal INPUT;

the first pull-down sub-circuit 103 transmitting the first voltage signal received at the first voltage signal terminal VSS1 to the first pull-down node PDo after the first pull-down sub-circuit 103 is turned on under the control of the input signal; and the first noise reduction sub-circuit 101 stopping transmitting the first voltage signal received at the first voltage signal terminal VSS1 to the pull-up node PU after the first noise reduction sub-circuit 101 is turned off under the control of the voltage of the first voltage signal transmitted to the first pull-down node PDo.

For example, as shown in FIGS. 3A and 3B, in a case where the first noise reduction sub-circuit 101 includes the first transistor M1, the input sub-circuit 102 includes the second transistor M2, and the first pull-down sub-circuit 103 includes the third transistor M3, the charging phase S2 includes following steps.

The second transistor M2 transmits the input signal received at the signal input terminal INPUT to the pull-up node PU after the second transistor M2 is turned on under the control of the input signal; the third transistor M3 transmits the first voltage signal received at the first voltage signal terminal VSS1 to the first pull-down node PDo after the third transistor M3 is turned on under the control of the input signal; and the first transistor M1 stops transmitting the first voltage signal received at the first voltage signal terminal VSS1 to the pull-up node PU after the first transistor M1 is turned off under the control of the voltage of the first pull-down node PDo.

In the above drive method, in the charging phase S2, while the input sub-circuit 102 is turned on under the control of the input signal to charge the pull-up node PU, the first pull-down sub-circuit 103 is also turned on under the control of the input signal to transmit the first voltage signal received at the first voltage signal terminal VSS1 to the first pull-down node PDo, so that the voltage of the first pull-down node PDo changes, and the first noise reduction sub-circuit 101 is turned off under the control of the voltage of the first pull-down node PDo to stop transmitting the first voltage signal vss1 to the pull-up node PU. Therefore, it is ensured that the pull-up node PU may be adequately charged.

In this way, compared to the shift register (in FIG. 1) in the related art in which the voltage of the pull-down node PD is pulled down in the charging phase by the pull-down control module composed of the transistor T5, the transistor T6, the transistor T7 and the transistor T8, in the drive method provided in the embodiments of the present disclosure, the voltage of the first pull-down node PDo may be rapidly pulled down by the first pull-down sub-circuit 103. This manner is more direct and effective, ensures that the pull-up node PU is adequately charged, and avoids that the voltage of the first pull-down node PDo cannot be rapidly pulled down due to the signal delay and the threshold voltage drift of the transistor, which affects the charging of the pull-up node PU. Thus, the reliability of the product is improved.

In some embodiments, as shown in FIGS. 2A to 3B and 4, in a case where the shift register RS further includes the first output sub-circuit 105, the energy storage sub-circuit 201, the second noise reduction sub-circuit 106 and the reset sub-circuit 107, the drive method of the gate drive circuit includes the noise reduction phase S1, the charging phase S2, an output phase S3 and a reset phase S4.

The noise reduction phase S1 further includes a following step.

The second noise reduction sub-circuit 106 transmits the third voltage signal received at the third voltage signal terminal VSS2 to the first signal output terminal OUTPUT after the second noise reduction sub-circuit 106 is turned on under the control of the voltage of the first pull-down node PDo.

For example, as shown in FIGS. 3A and 3B, in a case where the second noise reduction sub-circuit 106 includes the ninth transistor M9, the noise reduction phase further includes: the ninth transistor M9 transmitting the third voltage signal received at the third voltage signal terminal VSS2 to the first signal output terminal OUTPUT after the ninth transistor M9 is turned on under the control of the voltage of the first pull-down node PDo, so as to perform the noise reduction processing on the first signal output terminal OUTPUT.

The charging phase S2 further includes following steps.

The first output sub-circuit 105 transmits a low-level signal received at the clock signal terminal CLK to the first signal output terminal OUTPUT and the energy storage sub-circuit 201 after the first output sub-circuit 105 is turned on under the control of the voltage of the input signal transmitted to the pull-up node PU.

The energy storage sub-circuit 201 stores the voltage of the pull-up node PU.

For example, as shown in FIGS. 3A and 3B, in a case where the first output sub-circuit 105 includes the eighth transistor M8 and the energy storage sub-circuit 201 includes the first capacitor, the charging phase further includes: the eighth transistor M8 transmitting the low-level signal received at the clock signal terminal CLK to the first signal output terminal OUTPUT and the second terminal of the first capacitor after the eighth transistor M8 is turned on under the control of the voltage of the pull-up node PU. A voltage of the first terminal of the first capacitor is changed into the voltage of the pull-up node PU, and a voltage of the second terminal of the first capacitor is changed into a voltage of the low-level signal of the clock signal.

The output phase S3 includes following steps.

The energy storage sub-circuit 201 discharges the pull-up node PU, so that the first output sub-circuit 105 remains turned on under the control of the voltage of the pull-up node PU; and the first output sub-circuit 105 transmits a high-level signal received at the clock signal terminal CLK to the first signal output terminal OUTPUT and the energy storage sub-circuit 201. Thus, the voltage of the pull-up node PU is raised under an action of the energy storage sub-circuit 201.

For example, as shown in FIGS. 3A and 3B, in the case where the first output sub-circuit 105 includes the eighth transistor M8 and the energy storage sub-circuit 201 includes the first capacitor, the output phase includes: the eighth transistor M8 transmitting the high-level signal received at the clock signal terminal CLK to the first signal output terminal OUTPUT and the second terminal of the first capacitor. The voltage of the second terminal of the first capacitor is changed from the voltage of the low-level signal to a voltage of the high-level signal, and correspondingly, the voltage of the first terminal of the first capacitor is also raised according to a bootstrapping effect of a capacitor.

The reset phase S4 includes following steps.

The first output sub-circuit 105 remains turned on under the control of the voltage of the pull-up node PU, and transmits the low-level signal received at the clock signal terminal CLK to the first signal output terminal OUTPUT and the energy storage sub-circuit 201. Thus, the voltage of the pull-up node PU is reduced under the action of the energy storage sub-circuit 201.

The reset sub-circuit 107 transmits the first voltage signal received at the first voltage signal terminal VSS1 to the pull-up node PU after the reset sub-circuit 107 is turned on under the control of the reset signal transmitted by the reset signal terminal RESET.

For example, as shown in FIGS. 3A and 3B, in a case where the first output sub-circuit 105 includes the eighth transistor M8, the energy storage sub-circuit 201 includes the first capacitor, and the reset sub-circuit 107 includes the tenth transistor M10, the eighth transistor M8 remains turned on under the control of the voltage of the pull-up node PU, and transmits the low-level signal received at the clock signal terminal CLK to the first signal output terminal OUTPUT and the second terminal of the first capacitor. Thus, the voltage of the second terminal of the first capacitor is changed from the voltage of the high-level signal to the voltage of the low-level signal, and correspondingly, the voltage of the first terminal of the first capacitor is also reduced according to the bootstrapping effect of the capacitor. The tenth transistor M10 is turned on under the control of the reset signal, and transmits the first voltage signal received at the first voltage signal terminal VSS1 to the pull-up node PU, so as to reset the voltage of pull-up node PU.

On this basis, the drive method of the gate drive circuit provided in the embodiments of the present disclosure will be integrally and exemplarily introduced below. The following introduction will be described by considering the shift register RS shown in FIG. 3B as an example and combining a signal timing diagram shown in FIG. 4. Each shift register RS in the gate drive circuit includes the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13, the fourteenth transistor M14, the fifteenth transistor M15, the sixteenth transistor M16, the seventeenth transistor M17, the eighteenth transistor M18, the nineteenth transistor M19, the twentieth transistor M20, the twenty-first transistor M21 and the first capacitor C1, and the above transistors are all N-type transistors. The first voltage signal transmitted by the first voltage signal terminal VSS1 and the third voltage signal transmitted by the third voltage signal terminal VSS2 are low-level signals. In a certain period, in a case where the second voltage signal transmitted by the second voltage signal terminal VDDo is the high-level signal and the fourth voltage signal transmitted by the fourth voltage signal terminal VDDe is the low-level signal, the drive method of the gate drive circuit includes the noise reduction phase S1, the charging phase S2, the output phase S3 and the reset phase S4 included in a frame for each shift register RS in the gate drive circuit.

It will be noted that, since the fourth voltage signal transmitted by the fourth voltage signal terminal VDDe is the low-level signal, transistors related to the fourth voltage signal terminal VDDe and the second pull-down node PDe do not operate. For example, the eleventh transistor M11 the thirteenth transistor M13, the fifteenth transistor M15, the seventeenth transistor M17 and the twentieth transistor M20 are turned off, which is equivalent to being in a rest state, and thus these transistors will not be described in the following description of the drive method.

The noise reduction phase S1 includes the following steps.

In the noise reduction phase S1, the level of the second voltage signal is the high level, the level of the input signal transmitted by the input signal terminal and a level of the reset signal transmitted by the reset signal terminal RESET are the low levels, a level of the clock signal transmitted by the clock signal terminal CLK is the high level, and the voltage of the pull-up node PU is at the low level.

The fourth transistor M4 is turned on under the control of the second voltage signal to transmit the second voltage signal to the first control node P1, and the fifth transistor M5 is turned off under the control of the voltage of the pull-up node PU, so that the voltage of the first control node P1 is the high voltage. The sixth transistor M6 is turned on under the control of the voltage of the first control node P1 to transmit the second voltage signal to the first pull-down node PDo, and the seventh transistor M7 is turned off under the control of the voltage of the pull-up node PU, so that the voltage of the first pull-down node PDo is the high voltage.

The first transistor M1 is turned on under the control of the voltage of the first pull-down node PDo to transmit the first voltage signal to the pull-up node PU, so as to perform the noise reduction processing on the pull-up node PU. The ninth transistor M9 is turned on under the control of the voltage of the first pull-down node PDo to transmit the third voltage signal to the first signal output terminal OUTPUT, so as to perform the noise reduction processing on the first signal output terminal OUTPUT. The nineteenth transistor M19 is turned on under the control of the voltage of the first pull-down node PDo to transmit the first voltage signal to the second signal output terminal OC, so as to perform the noise reduction processing on the second signal output terminal OC.

The second transistor M2, the third transistor M3, the eighth transistor M8, the tenth transistor M10, the eighteenth transistor M18 and the twentieth transistor M20 are all in an OFF state.

The charging phase S2 includes the following steps.

In the charging phase, the level of the second voltage signal is the high level, the level of the input signal transmitted by the input signal terminal is the high level, the level of the reset signal transmitted by the reset signal terminal RESET is the low level, and the level of the dock signal transmitted by the clock signal terminal CLK is the low level.

The second transistor M2 is turned on under the control of the input signal to transmit the input signal to the pull-up node PU to charge the pull-up node PU, so that the voltage of the pull-up node PU is raised.

The third transistor M3 is turned on under the control of the input signal to transmit the first voltage signal to the first pull-down node PDo, so that the voltage of the first pull-down node PDo is pulled down.

The first transistor M1 is turned off under the control of the voltage of the first pull-down node PDo to stop transmitting the first voltage signal to the pull-up node PU, so that the pull-up node PU can be adequately charged.

The eighth transistor M8 is turned on under the control of the voltage of the pull-up node PU to transmit the low-level signal of the clock signal to the first signal output terminal OUTPUT and the second terminal of the first capacitor. The eighteenth transistor M18 is turned on under the control of the voltage of the pull-up node PU to transmit the low-level signal of the clock signal to the second signal output terminal OC.

The first capacitor stores the voltage of the pull-up node PU, the voltage of the first terminal of the first capacitor is the voltage of the pull-up node PU, and the voltage of the second terminal of the first capacitor is the voltage of the low-level signal of the clock signal.

In addition, the fourth transistor M4 is turned on under the control of the second voltage signal, and the fifth transistor M5 is turned on under the control of the voltage of the pull-up node PU, so that the voltage of the first control node P1 is pulled down to the low voltage. The sixth transistor M6 is turned off under the control of the voltage of the first control node P1, and the seventh transistor M7 is turned on under the control of the voltage of the pull-up node PU, so that the voltage of the first pull-down node PDo is pulled down to the low voltage. The ninth transistor M9 and the nineteenth transistor M19 are both turned off under the control of the first pull-down node PDo to stop performing the noise reduction processing on the first signal output terminal OUTPUT and the second signal output terminal OC.

The output phase S3 includes the following steps.

In the output phase, the level of the second voltage signal is the high level, the level of the input signal transmitted by the input signal terminal and the level of the reset signal transmitted by the reset signal terminal RESET are the low levels, and the level of the dock signal transmitted by the dock signal terminal CLK is the high level.

The first capacitor discharges the pull-up node PU, and the eighth transistor M8 continues to be turned on under the control of the voltage of the pull-up node PU to transmit the high-level signal of the clock signal to the first signal output terminal OUTPUT and the second terminal of the first capacitor. The eighteenth transistor M18 continues to be turned on under the control of the voltage of the pull-up node PU to transmit the high-level signal of the clock signal to the second signal output terminal OC.

The voltage of the second terminal of the first capacitor is raised from the voltage of the low-level signal of the clock signal to the voltage of the high-level signal, and the voltage of the first terminal of the first capacitor is raised under the bootstrapping effect of the capacitor, so that the voltage of the pull-up node PU is further raised.

In addition, the fourth transistor M4 is turned on under the control of the second voltage signal, and the fifth transistor M5 is turned on under the control of the voltage of the pull-up node PU, so that the voltage of the first control node P1 is still the low voltage. The sixth transistor M6 is turned off under the control of the voltage of the first control node P1, and the seventh transistor M7 is turned on under the control of the voltage of the pull-up node PU, so that the voltage of the first pull-down node PDo is still the low voltage. Both the ninth transistor M9 and the nineteenth transistor M19 are still turned off under the control of the first pull-down node PDo to stop performing the noise reduction on the first signal output terminal OUTPUT and the second signal output terminal OC.

The reset phase S4 includes the following steps.

Figure 4:
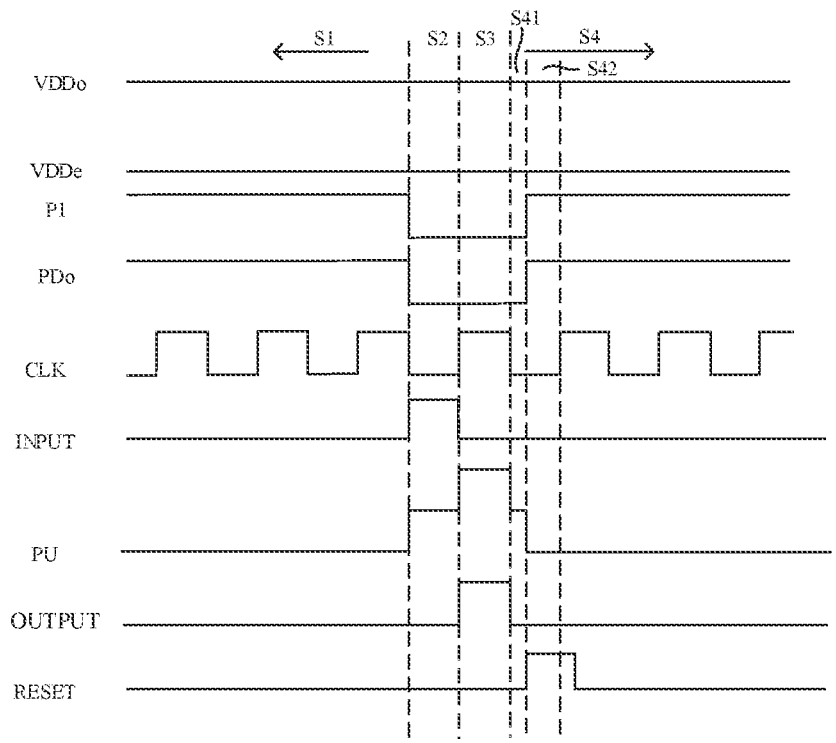
FIG. 4 is a signal timing diagram of a drive method of a gate drive circuit, in accordance with some embodiments of the present disclosure.

In the embodiments of the present disclosure, as shown in FIG. 4, in the reset phase S4, the level of the second voltage signal is the high level, the level of the input signal transmitted by the input signal terminal is the low level, and the level of the clock signal transmitted by the clock signal terminal CLK varies between the high level and the low level. The level of the reset signal transmitted by the reset signal terminal RESET is the high level in a period S42 of the reset phase S4.

In an initial period S41 of the reset phase S4, the level of the clock signal is the low level, the eighth transistor M8 continues to be turned on under the control of the voltage of the pull-up node PU to transmit the low-level signal of the clock signal to the first signal output terminal OUTPUT and the second terminal of the first capacitor, and the eighteenth transistor M18 continues to be turned on under the control of the voltage of the pull-up node PU to transmit the low-level signal of the dock signal to the second signal output terminal OC.

The voltage of the second terminal of the first capacitor is reduced from the voltage of the high-level signal of the dock signal to the voltage of the low-level signal, and the voltage of the first terminal of the first capacitor is reduced under the bootstrapping effect of the capacitor, so that the voltage of the pull-up node PU is reduced to the voltage in the charging phase.

The fourth transistor M4 is turned on under the control of the second voltage signal, and the fifth transistor M5 is turned on under the control of the voltage of the pull-up node PU, so that the voltage of the first control node P1 is still the low voltage. The sixth transistor M6 is turned off under the control of the voltage of the first control node P1, and the seventh transistor M7 is turned on under the control of the voltage of the pull-up node PU, so that the voltage of the first pull-down node PDo is still the low voltage. Both the ninth transistor M9 and the nineteenth transistor M19 are still turned off under the control of the first pull-down node PDo to stop performing the noise reduction on the first signal output terminal OUTPUT and the second signal output terminal OC.

After the initial period S41 of the reset phase S4, in the period S42, the level of the reset signal is raised to the high level, and the tenth transistor M10 is turned on under the control of the reset signal to transmit the first voltage signal to the pull-up node PU, so that the voltage of the pull-up node PU is pulled down.

The eighth transistor M8 is turned off under the control of the voltage of the pull-up node PU to stop transmitting the high-level signal of the clock signal to the first signal output terminal OUTPUT and the second terminal of the first capacitor. The eighteenth transistor M18 is turned off under the control of the voltage of the pull-up node PU to stop transmitting the high-level signal of the clock signal to the second signal output terminal OC.

The fourth transistor M4 is turned on under the control of the second voltage signal to transmit the second voltage signal to the first control node P1, and the fifth transistor M5 is turned off under the control of the voltage of the pull-up node PU, so that the voltage of the first control node P1 is the high voltage. The sixth transistor M6 is turned on under the control of the voltage of the first control node P1 to transmit the second voltage signal to the first pull-down node PDo, and the seventh transistor M7 is turned off under the control of the voltage of the pull-up node PU, so that the voltage of the first pull-down node PDo is the high voltage.

The first transistor M1 is turned on under the control of the voltage of the first pull-down node PDo to transmit the first voltage signal to the pull-up node PU, so as to perform the noise reduction processing on the pull-up node PU. The ninth transistor M9 is turned on under the control of the voltage of the first pull-down node PDo to transmit the third voltage signal to the first signal output terminal OUTPUT, so as to perform the noise reduction processing on the first signal output terminal OUTPUT. The nineteenth transistor M19 is turned on under the control of the voltage of the first pull-down node PDo to transmit the first voltage signal to the second signal output terminal OC, so as to perform the noise reduction processing on the second signal output terminal OC.

It will be noted that, turn-on and turn-off processes of the transistors in the above embodiments are all described by considering an example in which all transistors are the N-type transistors, the first voltage signal terminal VSS1 and the third voltage signal terminal VSS2 are low-level voltage terminals, and the second voltage signal terminal VDDo is a high-level voltage terminal. In a case where all transistors are P-type transistors, all control signals, the first voltage signal and the second voltage signal in FIG. 4 need to be reversed.

For a display apparatus to which the gate drive circuit applied, for example, for the liquid crystal display apparatus, the liquid crystal display apparatus includes a liquid crystal display panel and a printed circuit board (PCB), and the liquid crystal display panel includes the gate drive circuit, a source drive circuit and a plurality of pixel units. When the liquid crystal display panel displays an image, in the pixel unit, charges are accumulated on a pixel electrode and a common electrode, so that an electric field is formed between the pixel electrode and the common electrode to drive liquid crystals to deflect. When the display apparatus is shut down, accumulated charges may make corresponding pixels be at different grey-scales, so that an afterimage appears on a display screen of the display apparatus.

In order to solve a problem of the shutdown afterimage, an Xon function is turned on before the display apparatus is shut down. That is, a VGL voltage terminal and a VGH voltage terminal in the printed circuit board are short-circuited together, so that the gate scanning signals output by the gate drive circuit are all at the high level; and the high-level gate scanning signals are transmitted to the plurality of gate lines, so that thin film transistors in the pixel units are turned on, and the pixel units are rapidly discharged to eliminate the afterimage.

That is, for the gate drive circuit, the drive method further includes an operation of raising the gate scanning signals output by all shift registers RS included in the gate drive circuit 01 before the display apparatus to which the gate drive circuit is applied is shut down.

Figure 8:
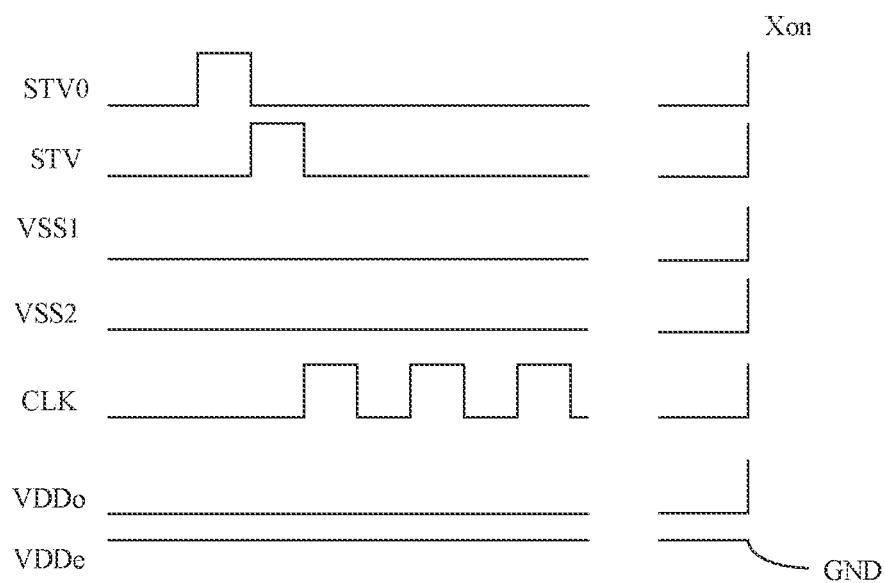
FIG. 8 is a signal timing diagram of a drive method of a gate drive circuit, in accordance with the related art.

In the related art, the gate drive circuit includes the plurality of shift registers as shown in FIG. 1, and a cascade manner of the gate drive circuit is that: the signal input terminal INPUT of the first-stage shift register is coupled to the start signal terminal STV; the signal input terminal INPUT of the any-stage shift register except the first-stale shift register is coupled to the signal output terminal of the previous-stage shift register of the any-stage shift register; the reset signal terminal RESET of the any-stage shift register except the last-stage shift register is coupled to the signal output terminal of the next-stage shift register of the any-stage shift register; and the reset signal terminal RESET of the last-stage shift register is coupled to the signal terminal separately provided for outputting the reset signal, or is coupled to the start signal terminal STV. In order to achieve that the gate scanning signals output by all the shift registers included in the gate drive circuit are raised before the display apparatus is shut down so that the shift registers output the high-level gate scanning signals, as shown in FIG. 8, all gate driver on array (GOA) signals need to be raised so that a voltage of the gate scanning signal output by each shift register is at the high level. When the display apparatus is shut down, all GOA signals are pulled down to ground.

Here, the GOA signals include a start signal transmitted by the start signal terminal STV, the first voltage signal transmitted by the first voltage signal terminal VSS1, the second voltage signal transmitted by the second voltage signal terminal VDDo, the clock signal transmitted by the clock signal terminal CLK and the initialization signal transmitted by the initialization signal terminal STV0, and do not include the input signal transmitted by the input signal terminal and the reset signal transmitted by the reset signal terminal RESET (the input signal terminal and the reset signal terminal RESET of the shift register RS have a cascade relationship with the adjacent shift register RS, so that the input signal and the reset signal belong to internal signals and are not included in the GOA signals).

In a case where the GOA signals are all raised, in the shift register, the voltage of the pull-up node PU and the voltage of the pull-down node PD are both raised. As a result, the transistor T9 is turned on under the control of the pull-down node PD to transmit a high-level clock signal to the signal output terminal, and a transistor T10 is turned on under the control of the pull-down node PD to transmit a high-level first voltage signal to the signal output terminal, thereby achieving that the voltage of the gate scanning signal output by each shift register RS is at the high level.

However, in the case where the GOA signals are all raised, in the shift register, charges at the pull-up node PU cannot be released after the voltage of the pull-up node PU is raised. That is, there are charges remaining at the pull-up node PU, which will result in transistors (e.g., a transistor T2 and a transistor T3) coupled to the pull-up node PU being in a stress state, thereby affecting electrical properties of the transistors and reducing the service life of the transistors.

Based on this, in some embodiments, based on the shift register RS as shown in FIGS. 2B and 3B and the gate drive circuit 01 as shown in FIG. 6B provided in the embodiments of the present disclosure, that is, in a case where the shift register RS further includes the initialization sub-circuit 115, the first pull-down control sub-circuit 104, the first output sub-circuit 105, the second noise reduction sub-circuit 106, the second output sub-circuit 112 and the fifth noise reduction sub-circuit 113, and a cascade manner of the shift registers RS is a cascade manner as shown in FIG. 6B, the operation of raising the gate scanning signals output by all shift registers RS included in the gate drive circuit 01 includes following steps.

Figure 9A:
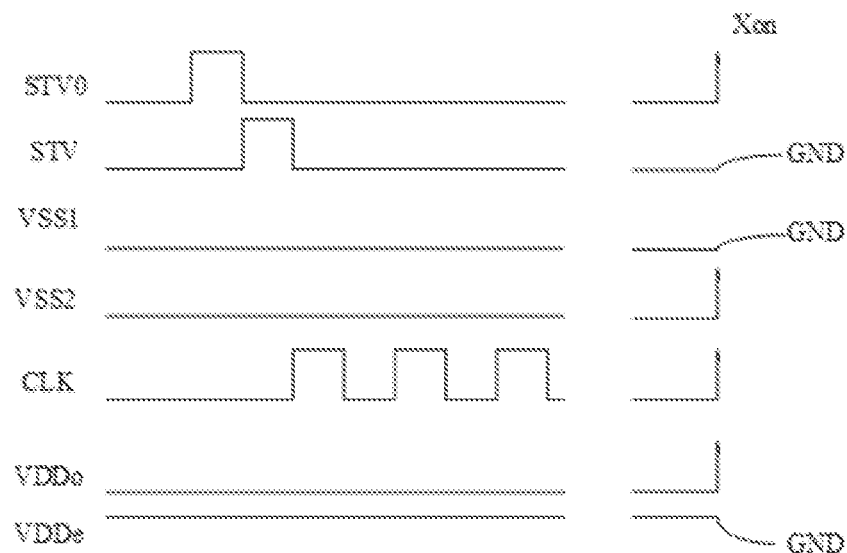
FIG. 9A is another signal timing diagram of a drive method of a gate drive circuit, in accordance with some embodiments of the present disclosure.

As shown in FIG. 9A, the first voltage signal output by the first voltage signal terminal VSS1 and the start signal output by the start signal terminal STV are both pulled down to ground; and the initialization signal output by the initialization signal terminal STV0, the second voltage signal output by the second voltage signal terminal VDDo, the third voltage signal output by the third voltage signal terminal VSS2 and the clock signal output by the clock signal terminal CLK are all raised. After performing the operation described above to the signals, a specific operation process of each shift register in the gate drive circuit 01 is as follows.

As shown in FIGS. 2B and 3B, the initialization sub-circuit 115 is turned on under the control of the initialization signal to transmit the first voltage signal to the pull-up node PU, so that the voltage of the pull-up node PU is a grounding voltage.

The first pull-down control sub-circuit 104 transmits the second voltage signal to the first pull-down node PDo in response to the second voltage signal and the voltage of the pull-up node PU, so that the voltage of the first pull-down node PDo is raised.

The second noise reduction sub-circuit 106 is turned on under the control of the voltage of the first pull-down node PDo to transmit the third voltage signal to the first signal output terminal OUTPUT, so that a voltage of a gate scanning signal output by the first signal output terminal OUTPUT is raised.

The first noise reduction sub-circuit 101 is turned on under the control of the voltage of the first pull-down node PDo to transmit the first voltage signal to the pull-up node PU, so that the voltage of the pull-up node PU is the grounding voltage. The fifth noise reduction sub-circuit 113 is turned on under the control of the voltage of the first pull-down node PDo to transmit the first voltage signal to the second signal output terminal OC, so that a voltage of a signal output by the second signal output terminal OC is the grounding voltage.

For the first-stage shift register RS1, since the signal input terminal INPUT thereof is coupled to the start signal terminal STV, and the start signal output by the start signal terminal STV is pulled down to ground, the input sub-circuit 102 thereof is turned off under control of the start signal, and the pull-up node PU will not be charged. For any shift register RS except the first-stage shift register RS1, the signal input terminal INPUT thereof is coupled to the second signal output terminal of the previous-stage shift register RS, and the voltage of the signal (hereinafter simply referred to as a second output signal) output by the second signal output terminal OC of the previous-stage shift register RS is the grounding voltage, so that the input sub-circuit 102 thereof is turned off under control of the second output signal, and the pull-up node PU will not be charged. In this way, the voltage of the pull-up node PU will not be raised. Moreover, the first noise reduction sub-circuit 101 and the initialization sub-circuit 115 are able to make the voltage of the pull-up node PU be the grounding voltage. Therefore, the charges do not remain at the pull-up node PU.

In the above drive method, based on the shift register RS as shown in FIGS. 2B and 3B and the gate drive circuit as shown in FIG. 6B, in each shift register RS, a sub-circuit having a connection relationship with the first signal output terminal OUTPUT and a sub-circuit having a connection relationship with the pull-up node PU are coupled to different voltage signal terminals. That is, the second noise reduction sub-circuit 106 having the connection relationship with the first signal output terminal OUTPUT is coupled to the third voltage signal terminal VSS2, and the first noise reduction sub-circuit 101 having the connection relationship with the pull-up node PU is coupled to the first voltage signal terminal VSS1, so that the first voltage signal output by the first voltage signal terminal VSS1 and the third voltage signal output by the third voltage signal terminal VSS2 may be set with different voltage changes.

Moreover, by providing two signal output terminals, i.e., the first signal output terminal OUTPUT used for outputting the gate scanning signal and the second signal output terminal OC used for outputting the second output signal to the cascaded shift register RS, signals output by the first signal output terminal OUTPUT and the second signal output terminal OC will not be affected by each other. Thus, when the Xon function is turned on before the display apparatus is shut down, on a premise of ensuring that the gate scanning signals output by all shift registers RS are all raised to solve the problem of the shutdown afterimage, it may be possible to prevent the charges remaining at the pull-up node PU in the shift register RS when the Xon function is turned on, thereby ensuring that the electrical properties of the thin film transistors in the shift register RS will not be affected, and improving a reliability of the gate drive circuit.

In some examples, as shown in FIG. 33, in a case where the first noise reduction sub-circuit 101 includes the first transistor M1, the input sub-circuit 102 includes the second transistor M2, the first pull-down sub-circuit 103 includes the third transistor M3, the first pull-down control sub-circuit 104 includes the fourth transistor M4, the fifth transistor M5, the sixth transistor M6, the seventh transistor M7 and the first control node P1, the first output sub-circuit 105 includes the eighth transistor M8, the second output sub-circuit 112 includes the eighteenth transistor M18, the second noise reduction sub-circuit 106 includes the ninth transistor M9, the fifth noise reduction sub-circuit 113 includes the nineteenth transistor M19, the initialization sub-circuit 115 includes the twenty-first transistor M21, and each transistor is the N-type transistor, in the above drive method, the operation of raising the gate scanning signals output by all shift registers RS included in the gate drive circuit includes the following steps.

The first voltage signal output by the first voltage signal terminal VSS1 and the start signal output by the start signal terminal STV are pulled down to ground, and the initialization signal output by the initialization signal terminal STV0, the second voltage signal output by the second voltage signal terminal VDDo, the third voltage signal output by the third voltage signal terminal VSS2 and the clock signal output by the clock signal terminal CLK are all raised.

The twenty-first transistor M21 is turned on under the control of the initialization signal to transmit the first voltage signal to the pull-up node PU, so as to pull down the voltage of the pull-up node PU.

The fourth transistor M4 is turned on under the control of the second voltage signal to transmit the second voltage signal to the first control node P1, and the fifth transistor M5 is turned off under the control of the voltage of the pull-up node PU, so that the voltage of the first control node P1 is the high voltage. The sixth transistor M6 is turned on under the control of the voltage of the first control node P1 to transmit the second voltage signal to the first pull-down node PDo, and the seventh transistor M7 is turned off under the control of the voltage of the pull-up node PU, so that the voltage of the first pull-down node PDo is raised to the high voltage.

The ninth transistor M9 is turned on under the control of the voltage of the first pull-down node PDo to transmit the third voltage signal to the first signal output terminal OUTPUT, so that the voltage of the gate scanning signal output by the first signal output terminal OUTPUT is raised.

The first transistor M1 is turned on under the control of the voltage of the first pull-down node PDo to transmit the first voltage signal to the pull-up node PU, so that the voltage of the pull-up node PU is the grounding voltage.

The nineteenth transistor M19 is turned on under the control of the voltage of the first pull-down node PDo to transmit the first voltage signal to the second signal output terminal OC, so that the voltage of the second output signal output by the second signal output terminal OC is the grounding voltage.

For the first-stage shift register RS1, the second transistor M2 is turned off under the control of the start signal, so that the pull-up node PU is not charged. For each of the second-stage shift register RS2 to an n-th-stage shift register RSn, the second transistor M2 is turned off under the control of the input signal (the input signal being the second output signal of the previous-stage shift register RS), so that the pull-up node PU is not charged.

In some other embodiments, based on the shift register RS as shown in FIGS. 2B and 3B and the gate drive circuit 01 as shown in FIG. 6B provided in the embodiments of the present disclosure, that is, in the case where the shift register RS further includes the initialization sub-circuit 115, the first pull-down control sub-circuit 104, the first output sub-circuit 105, the second noise reduction sub-circuit 106, the second output sub-circuit 112 and the fifth noise reduction sub-circuit 113, and the cascade manner of the shift registers RS is the cascade manner as shown in FIG. 6B, the operation of raising the gate scanning signals output by all shift registers RS included in the gate drive circuit up includes the following steps.

Figure 9B:
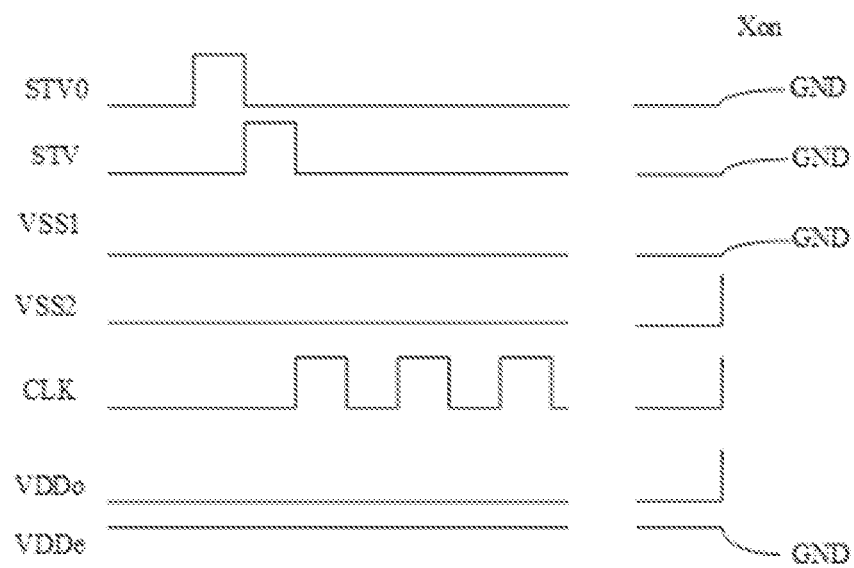
FIG. 9B is yet another signal timing diagram of a drive method of a gate drive circuit, in accordance with some embodiments of the present disclosure.

As shown in FIG. 9B, the first voltage signal output by the first voltage signal terminal VSS1, the start signal output by the start signal terminal STV and the initialization signal output by the initialization signal terminal STV0 are pulled down to ground; and the second voltage signal output by the second voltage signal terminal VDDo, the third voltage signal output by the third voltage signal terminal VSS2 and the clock signal output by the clock signal terminal CLK are all raised. After performing the operation described above to the signals, a specific operation process of each shift register in the gate drive circuit 01 is as follows.

The initialization sub-circuit 115 is turned off under the control of the initialization signal.

It will be noted that, even if the initialization sub-circuit 115 is turned off at this time so that the first voltage signal cannot be transmitted to the pull-up node PU, the voltage of the pull-up node PU is still the low voltage because no sub-circuit charges the pull-up node PU in this process.

The first pull-down control sub-circuit 104 transmits the second voltage signal to the first pull-down node PDo in response to the second voltage signal and the voltage of the pull-up node PU, so that the voltage of the first pull-down node PDo is raised.

The second noise reduction sub-circuit 106 is turned on under the control of the voltage of the first pull-down node PDo to transmit the third voltage signal to the first signal output terminal OUTPUT, so that the voltage of the gate scanning signal output by the first signal output terminal OUTPUT is raised.

The first noise reduction sub-circuit 101 is turned on under the control of the voltage of the first pull-down node PDo to transmit the first voltage signal to the pull-up node PU, so that the voltage of the pull-up node PU is the grounding voltage. The fifth noise reduction sub-circuit 113 is turned on under the control of the voltage of the first pull-down node PDo to transmit the first voltage signal to the second signal output terminal OC, so that the voltage of the signal output by the second signal output terminal OC is the grounding voltage.

For the first-stage shift register RS1, since the signal input terminal INPUT thereof is coupled to the start signal terminal STV, and the start signal output by the start signal terminal STV is pulled down to ground, the input sub-circuit 102 thereof is turned off under the control of the start signal, and the pull-up node PU will not be charged. For any shift register RS except the first-stage shift register RS1, the signal input terminal INPUT thereof is coupled to the second signal output terminal of the previous-stage shift register RS, and the voltage of the signal (hereinafter simply referred to as a second output signal) output by the second signal output terminal OC of the previous-stage shift register RS is the grounding voltage, so that the input sub-circuit 102 thereof is turned off under control of the second output signal, and the pull-up node PU will not be charged. In this way, the voltage of the pull-up node PU will not be raised. Moreover, the first noise reduction sub-circuit 101 is able to make the voltage of the pull-up node PU be the grounding voltage. Therefore, the charges do not remain at the pull-up node PU.

In the above drive method, based on the shift register RS as shown in FIGS. 2B and 3B and the gate drive circuit as shown in FIG. 6B, in each shift register RS, a sub-circuit having a connection relationship with the first signal output terminal OUTPUT and a sub-circuit having a connection relationship with the pull-up node PU are coupled to different voltage signal terminals. That is, the second noise reduction sub-circuit 106 having the connection relationship with the first signal output terminal OUTPUT is coupled to the third voltage signal terminal VSS2, and the first noise reduction sub-circuit 101 having the connection relationship with the pull-up node PU is coupled to the first voltage signal terminal VSS1, so that the first voltage signal output by the first voltage signal terminal VSS1 and the third voltage signal output by the third voltage signal terminal VSS2 may be set with different voltage changes.

Moreover, by providing two signal output terminals, i.e., the first signal output terminal OUTPUT used for outputting the gate scanning signal and the second signal output terminal OC used for outputting the second output signal to the cascaded shift register RS, signals output by the first signal output terminal OUTPUT and the second signal output terminal OC will not be affected by each other. Thus, when the Xon function is turned on before the display apparatus is shut down, on a premise of ensuring that the gate scanning signals output by all shift registers RS are all raised to solve the problem of the shutdown afterimage, it may be possible to prevent the charges remaining at the pull-up node PU in the shift register RS when the Xon function is turned on, thereby ensuring that the electrical properties of the thin film transistors in the shift register RS will not be affected, and improving a reliability of the gate drive circuit.

In some examples, as shown in FIG. 3B, in a case where the first noise reduction sub-circuit 101 includes the first transistor M1, the input sub-circuit 102 includes the second transistor M2, the first pull-down sub-circuit 103 includes the third transistor M3, the first pull-down control sub-circuit 104 includes the fourth transistor M4, the fifth transistor M5, the sixth transistor M6, the seventh transistor M7 and the first control node P1, the first output sub-circuit 105 includes the eighth transistor M8, the second output sub-circuit 112 includes the eighteenth transistor M18, the second noise reduction sub-circuit 106 includes the ninth transistor M9, the fifth noise reduction sub-circuit 113 includes the nineteenth transistor M19, the initialization sub-circuit 115 includes the twenty-first transistor M21, and each transistor is the N-type transistor, in the above drive method, the operation of raising the gate scanning signals output by all shift registers RS included in the gate drive circuit includes the following steps.

The first voltage signal output by the first voltage signal terminal VSS1, the start signal output by the start signal terminal STV and the initialization signal output by the initialization signal terminal STV0 are pulled down to ground; and the second voltage signal output by the second voltage signal terminal VDDo, the third voltage signal output by the third voltage signal terminal VSS2 and the clock signal output by the clock signal terminal CLK are all raised.

The twenty-first transistor M21 is turned off under the control of the initialization signal.

Since no transistor charges the pull-up node PU, the voltage of the pull-up node PU is the low voltage at this time.

The fourth transistor M4 is turned on under the control of the second voltage signal to transmit the second voltage signal to the first control node P1, and the fifth transistor M5 is turned off under the control of the voltage of the pull-up node PU, so that the voltage of the first control node P1 is the high voltage.

The sixth transistor M6 is turned on under the control of the voltage of the first control node P1 to transmit the second voltage signal to the first pull-down node PDo, and the seventh transistor M7 is turned off under the control of the voltage of the pull-up node PU, so that the voltage of the first pull-down node PDo is raised to the high voltage.

The ninth transistor M9 is turned on under the control of the voltage of the first pull-down node PDo to transmit the third voltage signal to the first signal output terminal OUTPUT, so that the voltage of the gate scanning signal output by the first signal output terminal OUTPUT is raised.

The first transistor M1 is turned on under the control of the voltage of the first pull-down node PDo to transmit the first voltage signal to the pull-up node PU, so that the voltage of the pull-up node PU is the grounding voltage.

The nineteenth transistor M19 is turned on under the control of the voltage of the first pull-down node PDo to transmit the first voltage signal to the second signal output terminal OC, so that the voltage of the second output signal output by the second signal output terminal OC is the grounding voltage.

For the first-stage shift register RS1, the second transistor M2 is turned off under the control of the start signal, so that the pull-up node PU is not charged. For each of the second-stage shift register RS2 to the n-th-stage shift register RSn, the second transistor M2 is turned off under the control of the input signal (the input signal being the second output signal of the previous-stage shift register RS), so that the pull-up node PU is not charged.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A drive method of a gate drive circuit, the gate drive circuit including at least two cascaded shift registers, each register including a pull-up node, a first pull-down node, an input sub-circuit, a first noise reduction sub-circuit and a first pull-down sub-circuit, the first noise reduction sub-circuit being coupled to the pull-up node, the first pull-down node and a first voltage signal terminal, the input sub-circuit being coupled to the pull-up node and a signal input terminal, the first pull-down sub-circuit being coupled to the signal input terminal, the first pull-down node and the first voltage signal terminal, the drive method comprising:
 a noise reduction phase and a charging phase included in a frame period for each shift register in the gate drive circuit, wherein the noise reduction phase including:
  transmitting, by the first noise reduction sub-circuit, a first voltage signal received at the first voltage signal terminal to the pull-up node after the first noise reduction sub-circuit is turned on under control of a voltage of the first pull-down node;
 the charging phase including:
  transmitting, by the input sub-circuit, an input signal received at the signal input terminal to the pull-up node after the input sub-circuit is turned on under control of the input signal transmitted by the signal input terminal;
  transmitting, by the first pull-down sub-circuit, the first voltage signal received at the first voltage signal terminal to the first pull-down node after the first pull-down sub-circuit is turned on under the control of the input signal; and
  stopping transmitting, by the first noise reduction sub-circuit, the first voltage signal received at the first voltage signal terminal to the pull-up node after the first noise reduction sub-circuit is turned off under the control of the voltage of the first voltage signal transmitted to the first pull-down node, wherein the method further comprises:
 an operation of raising gate scanning signals output by all shift registers included in the gate drive circuit before a display apparatus to which the gate drive circuit is applied is shut down, wherein the shift register further includes a reset sub-circuit, an initialization sub-circuit, a first pull-down control sub-circuit, a first output sub-circuit, a second noise reduction sub-circuit, a second output sub-circuit and a fifth noise reduction sub-circuit the reset sub-circuit is coupled to the pull-up node, the first voltage signal terminal and a reset signal terminal;
 the initialization sub-circuit is coupled to the pull-up node, an initialization signal terminal and the first voltage signal terminal;
 the first pull-down control sub-circuit is coupled to the first voltage signal terminal, a second voltage signal terminal, the pull-up node and the first pull-down node;
 the first output sub-circuit is coupled to a clock signal terminal, the pull-up node and a first signal output terminal;
 the second noise reduction sub-circuit is coupled to the first pull-down node, a third voltage signal terminal and the first signal output terminal;
 the second output sub-circuit is coupled to the pull-up node, the clock signal terminal and a second signal output terminal; and
 the fifth noise reduction sub-circuit is coupled to the first pull-down node, the first voltage signal terminal and the second signal output terminal;
wherein a signal input terminal of a first-stage shift register is coupled to a start signal terminal;
a signal input terminal of an any-stage shift register except the first-stage shift register is coupled to a second signal output terminal of a previous-stage shift register of the any-stage shift register;
a reset signal terminal of an any-stage shift register except a last-stage shift register is coupled to a second signal output terminal of a next-stage shift register of the any-stage shift register;
a reset signal terminal of the last-stage shift register is coupled to a signal terminal separately provided for outputting a reset signal, or is coupled to the start signal terminal; and
a first signal output terminal of each shifter register is coupled to a single gate line;
wherein the operation of raising the gate scanning signals output by all shift registers included in the gate drive circuit, includes:
 pulling down the first voltage signal output by the first voltage signal terminal and a start signal output by the start signal terminal to ground, and raising an initialization signal output by the initialization signal terminal, a second voltage signal output by the second voltage signal terminal, a third voltage signal output by the third voltage signal terminal and a clock signal output by the clock signal terminal, so that the initialization sub-circuit is turned on under control of the initialization signal, and the initialization sub-circuit transmits the first voltage signal to the pull-up node after, such that a voltage of the pull-up node is a grounding voltage;
 the first pull-down control sub-circuit transmits the second voltage signal to the first pull-down node in response to the second voltage signal and the grounding voltage of the pull-up node, such that a voltage of the first pull-down node is raised;
 the second noise reduction sub-circuit is turned on under control of the voltage of the first pull-down node, and the second noise reduction sub-circuit transmits the third voltage signal to the first signal output terminal, such that a voltage of a gate scanning signal output by the first signal output terminal is raised:
 the first noise reduction sub-circuit is turned on under the control of the voltage of the first pull-down node, and the first noise reduction sub-circuit transmits the first voltage signal to the pull-up node, such that the voltage of the pull-up node is the grounding voltage; and the fifth noise reduction sub-circuit is turned on under the control of the voltage of the first pull-down node, and the fifth noise reduction sub-circuit transmits the first voltage signal to the second signal output terminal, such that a voltage of a signal output by the second signal output terminal is the grounding voltage; or wherein the operation of raising the gate scanning signals output by all shift registers included in the gate drive circuit, includes:

pulling down the first voltage signal output by the first voltage signal terminal, a start signal output by the start signal terminal and an initialization signal output by the initialization signal terminal to ground, and raising a second voltage signal output by the second voltage signal terminal, a third voltage signal output by the third voltage signal terminal and a clock signal output by the clock signal terminal, so that the initialization sub-circuit is turned off under control of the initialization signal, the first pull-down control sub-circuit transmits the second voltage signal to the first pull-down node in response to the second voltage signal and a voltage of the pull-up node, such that a voltage of the first pull-down node is raised;

the second noise reduction sub-circuit is turned on under control of the voltage of the first pull-down node, and the second noise reduction sub-circuit transmits the third voltage signal to a first signal output terminal, such that a voltage of a gate scanning signal output by the first signal output terminal is raised;

the first noise reduction sub-circuit is turned on under the control of the voltage of the first pull-down node, and the first noise reduction sub-circuit transmits the first voltage signal to the pull-up node, such that the voltage of the pull-up node is the grounding voltage; and the fifth noise reduction sub-circuit is turned on under the control of the voltage of the first pull-down node, and the fifth noise reduction sub-circuit transmits the first voltage signal to the second signal output terminal, such that a voltage of a signal output by the second signal output terminal is the grounding voltage.

2. A gate drive circuit driven by the method according to claim 1, the gate drive circuit including at least two cascaded shift registers, each shift register, comprising the pull-up node, the first pull-down node, the input sub-circuit, the first noise reduction sub-circuit, the first pull-down sub-circuit, the reset sub-circuit, the initialization sub-circuit, the first pull-down control sub-circuit, the first output sub-circuit, the second noise reduction sub-circuit, the second output sub-circuit and the fifth noise reduction sub-circuit, wherein the first noise reduction sub-circuit is coupled to the pull-up node, the first pull-down node and the first voltage signal terminal;

the first noise reduction sub-circuit is configured to transmit the first voltage signal received at the first voltage signal terminal to the pull-up node under the control of the voltage of the first pull-down node;

the input sub-circuit is coupled to the pull-up node and the signal input terminal; the input sub-circuit is configured to transmit the input signal to the pull-up node in response to the input signal received at the signal input terminal;

the first pull-down sub-circuit is coupled to the signal input terminal, the first pull-down node and the first voltage signal terminal; the first pull-down sub-circuit is configured to transmit the first voltage signal received at the first voltage signal terminal to the first pull-down node in response to the input signal received at the signal input terminal, so that the first noise reduction sub-circuit is turned off under the control of the voltage of the first voltage signal transmitted to the first pull-down node to stop transmitting the first voltage signal to the pull-up node;

the reset sub-circuit is coupled to the pull-up node, the first voltage signal terminal and the reset signal terminal; the reset sub-circuit is configured to transmit the first voltage signal received at the first voltage signal terminal to the pull-up node in response to the reset signal received at the reset signal terminal;

the initialization sub-circuit is coupled to the pull-up node, the initialization signal terminal and the first voltage signal terminal; the initialization sub-circuit is configured to transmit the first voltage signal received at the first voltage signal terminal to the pull-up node in response to the initialization signal received at the initialization signal terminal;

the first pull-down control sub-circuit is coupled to the first voltage signal terminal, the second voltage signal terminal, the pull-up node and the first pull-down node; and the first pull-down control sub-circuit is configured to: transmit the second voltage signal received at the second voltage signal terminal to the first pull-down node in response to the second voltage signal received at the second voltage signal terminal and the voltage of the first voltage signal transmitted to the pull-up node; and transmit the first voltage signal received at the first voltage signal terminal to the first pull-down node in response to the second voltage signal received at the second voltage signal terminal and a voltage of the input signal transmitted to the pull-up node;

the first output sub-circuit is coupled to the clock signal terminal, the pull-up node and the first signal output terminal; and the first output sub-circuit is configured to transmit the clock signal received at the clock signal terminal to the first signal output terminal under control of the voltage of the input signal transmitted to the pull-up node;

the second noise reduction sub-circuit is coupled to the first pull-down node, the third voltage signal terminal and the first signal output terminal; and the second noise reduction sub-circuit is configured to transmit the third voltage signal received at the third voltage signal terminal to the first signal output terminal under the control of the voltage of the first pull-down node;

the second output sub-circuit is coupled to the pull-up node, the clock signal terminal and the second signal output terminal; and the second output sub-circuit is configured to transmit the clock signal received at the clock signal terminal to the second signal output terminal under the control of the voltage of the input signal transmitted to the pull-up node; and the fifth noise reduction sub-circuit is coupled to the first pull-down node, the first voltage signal terminal and the second signal output terminal; and the fifth noise reduction sub-circuit is configured to transmit the first voltage signal received at the first voltage signal terminal to the second signal output terminal under the control of the voltage of the first pull-down node.

3. The gate drive circuit according to claim 2, wherein the first noise reduction sub-circuit includes a first transistor, a control electrode of the first transistor is coupled to the first pull-down node, a first electrode of the first transistor is coupled to the first voltage signal terminal, and a second electrode of the first transistor is coupled to the pull-up node;

the input sub-circuit includes a second transistor, a control electrode of the second transistor is coupled to the signal input terminal, a first electrode of the second transistor is coupled to the signal input terminal, and a second electrode of the second transistor is coupled to the pull-up node; and the first pull-down sub-circuit includes a third transistor, a control electrode of the third transistor is coupled to the signal input terminal, a first electrode of the third transistor is coupled to the first voltage signal terminal, and a second electrode of the third transistor is coupled to the first pull-down node.

4. The gate drive circuit according to claim 2, wherein the first pull-down control sub-circuit includes a fourth transistor, a fifth transistor, a sixth transistor, a seventh transistor and a first control node;

a control electrode of the fourth transistor is coupled to the second voltage signal terminal, a first electrode of the fourth transistor is coupled to the second voltage signal terminal, and a second electrode of the fourth transistor is coupled to the first control node;

a control electrode of the fifth transistor is coupled to the pull-up node, a first electrode of the fifth transistor is coupled to the first voltage signal terminal, and a second electrode of the fifth transistor is coupled to the first control node;

a control electrode of the sixth transistor is coupled to the first control node, a first electrode of the sixth transistor is coupled to the second voltage signal terminal, and a second electrode of the sixth transistor is coupled to the first pull-down node; and a control electrode of the seventh transistor is coupled to the pull-up node, a first electrode of the seventh transistor is coupled to the first voltage signal terminal, and a second electrode of the seventh transistor is coupled to the first pull-down node.

5. The gate drive circuit according to claim 2, further comprising: an energy storage sub-circuit, wherein the energy storage sub-circuit is coupled to the pull-up node and the first output sub-circuit; and the energy storage sub-circuit is configured to store the voltage of the input signal transmitted to the pull-up node.

6. The gate drive circuit according to claim 5, wherein the first output sub-circuit includes an eighth transistor, a control electrode of the eighth transistor is coupled to the pull-up node, a first electrode of the eighth transistor is coupled to the clock signal terminal, and a second electrode of the eighth transistor is coupled to the first signal output terminal;

the energy storage sub-circuit includes a first capacitor, a first terminal of the first capacitor is coupled to the pull-up node, and a second terminal of the first capacitor is coupled to the second electrode of the eighth transistor;

the second noise reduction sub-circuit includes a ninth transistor, a control electrode of the ninth transistor is coupled to the first pull-down node, a first electrode of the ninth transistor is coupled to the third voltage signal terminal, and a second electrode of the ninth transistor is coupled to the first signal output terminal; and the reset sub-circuit includes a tenth transistor, a control electrode of the tenth transistor is coupled to the reset signal terminal, a first electrode of the tenth transistor is coupled to the first voltage signal terminal, and a second electrode of the tenth transistor is coupled to the pull-up node.

7. The gate drive circuit according to claim 5, further comprising:

a second pull-down node, a second pull-down control sub-circuit, a third noise reduction sub-circuit and a second pull-down sub-circuit, wherein the second pull-down control sub-circuit is coupled to the first voltage signal terminal, a fourth voltage signal terminal, the pull-up node and the second pull-down node;

the second pull-down control sub-circuit is configured to transmit: a fourth voltage signal received at the fourth voltage signal terminal to the second pull-down node in response to the fourth voltage signal received at the fourth voltage signal terminal and the voltage of the first voltage signal transmitted to the pull-up node; and transmit the first voltage signal received at the first voltage signal terminal to the second pull-down node in response to the fourth voltage signal received at the fourth voltage signal terminal and the voltage of the input signal transmitted to the pull-up node;

the third noise reduction sub-circuit is coupled to the pull-up node, the second pull-down node and the first voltage signal terminal; and the third noise reduction sub-circuit is configured to transmit the first voltage signal received at the first voltage signal terminal to the pull-up node under control of a voltage of the fourth voltage signal transmitted to the second pull-down node;

the second pull-down sub-circuit is coupled to the signal input terminal, the second pull-down node and the first voltage signal terminal; and the second pull-down sub-circuit is configured to transmit the first voltage signal received at the first voltage signal terminal to the second pull-down node in response to the input signal received at the signal input terminal, so that the third noise reduction sub-circuit is turned off under control of the voltage of the first voltage signal transmitted to the second pull-down node to stop transmitting the first voltage signal to the pull-up node.

8. The gate drive circuit according to claim 7, wherein the second pull-down control sub-circuit includes an eleventh transistor, a twelfth transistor, a thirteenth transistor, a fourteenth transistor and a second control node, wherein a control electrode of the eleventh transistor is coupled to the fourth voltage signal terminal, a first electrode of the eleventh transistor is coupled to the fourth voltage signal terminal, and a second electrode of the eleventh transistor is coupled to the second control node;

a control electrode of the twelfth transistor is coupled to the pull-up node, a first electrode of the twelfth transistor is coupled to the first voltage signal terminal, and a second electrode of the twelfth transistor is coupled to the second control node;

a control electrode of the thirteenth transistor is coupled to the second control node, a first electrode of the thirteenth transistor is coupled to the fourth voltage signal terminal, and a second electrode of the thirteenth transistor is coupled to the second pull-down node; and a control electrode of the fourteenth transistor is coupled to the pull-up node, a first electrode of the fourteenth transistor is coupled to the first voltage signal terminal, and a second electrode of the fourteenth transistor is coupled to the second pull-down node;

the third noise reduction sub-circuit includes a fifteenth transistor, a control electrode of the fifteenth transistor is coupled to the second pull-down node, a first electrode of the fifteenth transistor is coupled to the first voltage signal terminal, and a second electrode of the fifteenth transistor is coupled to the pull-up node; and the second pull-down sub-circuit includes a sixteenth transistor, a control electrode of the sixteenth transistor is coupled to the signal input terminal, a first electrode of the sixteenth transistor is coupled to the first voltage signal terminal, and a second electrode of the sixteenth transistor is coupled to the second pull-down node.

9. The gate drive circuit according to claim 7, further comprising a fourth noise reduction sub-circuit, wherein the fourth noise reduction sub-circuit is coupled to the second pull-down node, the third voltage signal terminal and the first signal output terminal;

the fourth noise reduction sub-circuit is configured to transmit the third voltage signal received at the third voltage signal terminal to the first signal output terminal under the control of the voltage of the fourth voltage signal transmitted to the second pull-down node.

10. The gate drive circuit according to claim 9, wherein the fourth noise reduction sub-circuit includes a seventeenth transistor;

a control electrode of the seventeenth transistor is coupled to the second pull-down node, a first electrode of the seventeenth transistor is coupled to the third voltage signal terminal, and a second electrode of the seventeenth transistor is coupled to the first signal output terminal.

11. The gate drive circuit according to claim 9, further comprising: a sixth noise reduction sub-circuit, wherein the sixth noise reduction sub-circuit is coupled to the second pull-down node, the first voltage signal terminal and the second signal output terminal; and the sixth noise reduction sub-circuit is configured to transmit the first voltage signal received at the first voltage signal terminal to the second signal output terminal under the control of the voltage of the fourth voltage signal transmitted to the second pull-down node.

12. The gate drive circuit according to claim 11, wherein the second output sub-circuit includes an eighteenth transistor, a control electrode of the eighteenth transistor is coupled to the pull-up node, a first electrode of the eighteenth transistor is coupled to the clock signal terminal, and a second electrode of the eighteenth transistor is coupled to the second signal output terminal;

the fifth noise reduction sub-circuit includes a nineteenth transistor, a control electrode of the nineteenth transistor is coupled to the first pull-down node, a first electrode of the nineteenth transistor is coupled to the first voltage signal terminal, and a second electrode of the nineteenth transistor is coupled to the second signal output terminal; and the sixth noise reduction sub-circuit includes a twentieth transistor, a control electrode of the twentieth transistor is coupled to the second pull-down node, a first electrode of the twentieth transistor is coupled to the first voltage signal terminal, and a second electrode of the twentieth transistor is coupled to the second signal output terminal.

13. The gate drive circuit according to claim 2, wherein the initialization sub-circuit includes a twenty-first transistor, a control electrode of the twenty-first transistor is coupled to the initialization signal terminal, a first electrode of the twenty-first transistor is coupled to the first voltage signal terminal, and a second electrode of the twenty-first transistor is coupled to the pull-up node.

14. The gate drive circuit according to claim 2, further comprising:

a second pull-down node, an energy storage sub-circuit, a second pull-down control sub-circuit, a third noise reduction sub-circuit, a second pull-down sub-circuit, a fourth noise reduction sub-circuit, and a sixth noise reduction sub-circuit;

the first noise reduction sub-circuit includes a first transistor, the input sub-circuit includes a second transistor, the first pull-down sub-circuit includes a third transistor, and the first pull-down control sub-circuit includes a fourth transistor, a fifth transistor, a sixth transistor, a seventh transistor and a first control node;

the first output sub-circuit includes an eighth transistor, the energy storage sub-circuit includes a first capacitor, the second noise reduction sub-circuit includes a ninth transistor, and the reset sub-circuit includes a tenth transistor;

the second pull-down control sub-circuit includes an eleventh transistor, a twelfth transistor, a thirteenth transistor, a fourteenth transistor and a second control node, the third noise reduction sub-circuit includes a fifteenth transistor, the second pull-down sub-circuit includes a sixteenth transistor, and the fourth noise reduction sub-circuit includes a seventeenth transistor;

the second output sub-circuit includes an eighteenth transistor, the fifth noise reduction sub-circuit includes a nineteenth transistor, the sixth noise reduction sub-circuit includes a twentieth transistor, and the initialization sub-circuit includes a twenty-first transistor;

a control electrode of the first transistor is coupled to the first pull-down node, a first electrode of the first transistor is coupled to the first voltage signal terminal, and a second electrode of the first transistor is coupled to the pull-up node;

a control electrode of the second transistor is coupled to the signal input terminal, a first electrode of the second transistor is coupled to the signal input terminal, and a second electrode of the second transistor is coupled to the pull-up node;

a control electrode of the third transistor is coupled to the signal input terminal, a first electrode of the third transistor is coupled to the first voltage signal terminal, and a second electrode of the third transistor is coupled to the first pull-down node;

a control electrode of the fourth transistor is coupled to the second voltage signal terminal, a first electrode of the fourth transistor is coupled to the second voltage signal terminal, and a second electrode of the fourth transistor is coupled to the first control node;

a control electrode of the fifth transistor is coupled to the pull-up node, a first electrode of the fifth transistor is coupled to the first voltage signal terminal, and a second electrode of the fifth transistor is coupled to the first control node;

a control electrode of the sixth transistor is coupled to the first control node, a first electrode of the sixth transistor is coupled to the second voltage signal terminal, and a second electrode of the sixth transistor is coupled to the first pull-down node;

a control electrode of the seventh transistor is coupled to the pull-up node, a first electrode of the seventh transistor is coupled to the first voltage signal terminal, and a second electrode of the seventh transistor is coupled to the first pull-down node;

a control electrode of the eighth transistor is coupled to the pull-up node, a first electrode of the eighth transistor is coupled to the clock signal terminal, and a second electrode of the eighth transistor is coupled to the first signal output terminal;

a first terminal of the first capacitor is coupled to the pull-up node, and a second terminal of the first capacitor is coupled to the second electrode of the eighth transistor;

a control electrode of the ninth transistor is coupled to the first pull-down node, a first electrode of the ninth transistor is coupled to a third voltage signal terminal, and a second electrode of the ninth transistor is coupled to the first signal output terminal;

a control electrode of the tenth transistor is coupled to the reset signal terminal, a first electrode of the tenth transistor is coupled to the first voltage signal terminal, and a second electrode of the tenth transistor is coupled to the pull-up node;

a control electrode of the eleventh transistor is coupled to a fourth voltage signal terminal, a first electrode of the eleventh transistor is coupled to the fourth voltage signal terminal, and a second electrode of the eleventh transistor is coupled to the second control node;

a control electrode of the twelfth transistor is coupled to the pull-up node, a first electrode of the twelfth transistor is coupled to the first voltage signal terminal, and a second electrode of the twelfth transistor is coupled to the second control node;

a control electrode of the thirteenth transistor is coupled to the second control node, a first electrode of the thirteenth transistor is coupled to the fourth voltage signal terminal, and a second electrode of the thirteenth transistor is coupled to the second pull-down node;

a control electrode of the fourteenth transistor is coupled to the pull-up node, a first electrode of the fourteenth transistor is coupled to the first voltage signal terminal, and a second electrode of the fourteenth transistor is coupled to the second pull-down node;

a control electrode of the fifteenth transistor is coupled to the second pull-down node, a first electrode of the fifteenth transistor is coupled to the first voltage signal terminal, and a second electrode of the fifteenth transistor is coupled to the pull-up node;

a control electrode of the sixteenth transistor is coupled to the signal input terminal, a first electrode of the sixteenth transistor is coupled to the first voltage signal terminal, and a second electrode of the sixteenth transistor is coupled to the second pull-down node;

a control electrode of the seventeenth transistor is coupled to the second pull-down node, a first electrode of the seventeenth transistor is coupled to the third voltage signal terminal, and a second electrode of the seventeenth transistor is coupled to the first signal output terminal;

a control electrode of the eighteenth transistor is coupled to the pull-up node, a first electrode of the eighteenth transistor is coupled to the clock signal terminal, and a second electrode of the eighteenth transistor is coupled to the second signal output terminal;

a control electrode of the nineteenth transistor is coupled to the first pull-down node, a first electrode of the nineteenth transistor is coupled to the first voltage signal terminal, and a second electrode of the nineteenth transistor is coupled to the second signal output terminal;

a control electrode of the twentieth transistor is coupled to the second pull-down node, a first electrode of the twentieth transistor is coupled to the first voltage signal terminal, and a second electrode of the twentieth transistor is coupled to the second signal output terminal; and a control electrode of the twenty-first transistor is coupled to an initialization signal terminal, a first electrode of the twenty-first transistor is coupled to the first voltage signal terminal, and a second electrode of the twenty-first transistor is coupled to the pull-up node.

* * * * *